(12) United States Patent
Iguchi et al.

(10) Patent No.: US 7,382,015 B2
(45) Date of Patent: Jun. 3, 2008

(54) SEMICONDUCTOR DEVICE INCLUDING AN ELEMENT ISOLATION PORTION HAVING A RECESS

(75) Inventors: Tadashi Iguchi, Yokkaichi (JP); Yoshiaki Himeno, Yokkaichi (JP); Hiroaki Tsunoda, Yokkaichi (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 0 days.

(21) Appl. No.: 11/094,467

(22) Filed: Mar. 31, 2005

(65) Prior Publication Data

US 2005/0167732 A1 Aug. 4, 2005

Related U.S. Application Data

(62) Division of application No. 10/716,556, filed on Nov. 20, 2003, now Pat. No. 6,974,746, which is a division of application No. 09/732,723, filed on Dec. 11, 2000, now Pat. No. 6,720,610.

(30) Foreign Application Priority Data

Dec. 9, 1999 (JP) ................................. 11-350841

(51) Int. Cl.
*H01L 29/76* (2006.01)
*H01L 29/788* (2006.01)
*H01L 29/792* (2006.01)
*H01L 29/94* (2006.01)
*H01L 29/00* (2006.01)

(52) U.S. Cl. ............... 257/315; 257/314; 257/316; 257/317; 257/318; 257/319; 257/320; 257/321; 257/322; 257/323; 257/324; 257/325; 257/326; 257/374; 257/499; 257/500; 257/501; 257/502; 257/503; 257/504; 257/505; 257/506; 257/507; 257/508; 257/509; 257/510; 257/513; 257/519; 257/520; 257/521; 257/523; 257/524

(58) Field of Classification Search ........ 257/316–322, 257/314–315, 323–326, 499–510, 513, 519, 257/520–521, 523–524, 374
See application file for complete search history.

(56) References Cited

U.S. PATENT DOCUMENTS 4,314,265 A * 2/1982 Simko ..................... 365/185.1

(Continued)

FOREIGN PATENT DOCUMENTS

EP 463510 A2 * 1/1992

(Continued)

OTHER PUBLICATIONS

K. Shimizu, et al., "A Novel High-Density 5F2 NAND STI Cell Technology Suitable for 256Mbit and 1Gbit Flash Memories", Microelectronics Engineering Laboratory, IEDM 97-271-274.

(Continued)

*Primary Examiner*—Ida M. Soward
(74) *Attorney, Agent, or Firm*—Oblon, Spivak, McClelland, Maier & Neustadt, P.C.

(57) ABSTRACT

A non-volatile semiconductor memory device, which is intended to prevent data destruction by movements of electric charges between floating gates and thereby improve the reliability, includes element isolation/insulation films buried into a silicon substrate to isolate stripe-shaped element-forming regions. Formed on the substrate are a floating gate via a first gate insulating film and further a control gate via a second gate insulating film. Source and drain diffusion layers are formed in self-alignment with control gates. The second gate insulating film on the floating gate is divided and separated together with the floating gate by slits above the element isolation/insulation films into discrete portions of individual memory cells.

44 Claims, 22 Drawing Sheets

U.S. PATENT DOCUMENTS

| | | | |
|---|---|---|---|
| 4,486,769 A * | 12/1984 | Simko | 257/317 |
| 4,892,840 A * | 1/1990 | Esquivel et al. | 438/262 |
| 5,017,980 A * | 5/1991 | Gill et al. | 365/185.06 |
| 5,051,795 A * | 9/1991 | Gill et al. | 257/317 |
| 5,156,990 A * | 10/1992 | Mitchell | 438/201 |
| 5,159,431 A * | 10/1992 | Yoshikawa | 257/316 |
| 5,399,891 A * | 3/1995 | Yiu et al. | 365/185.16 |
| 5,420,060 A | 5/1995 | Gill et al. | 438/261 |
| 5,475,251 A * | 12/1995 | Kuo et al. | 257/316 |
| 5,656,837 A * | 8/1997 | Lancaster et al. | 257/314 |
| 5,686,333 A * | 11/1997 | Sato | 438/257 |
| 5,696,399 A * | 12/1997 | Cereda et al. | 257/385 |
| 5,851,881 A * | 12/1998 | Lin et al. | 438/261 |
| 5,874,353 A | 2/1999 | Lin et al. | 438/592 |
| 5,949,101 A | 9/1999 | Aritome | 257/315 |
| 6,034,394 A * | 3/2000 | Ramsbey et al. | 257/316 |
| 6,034,395 A * | 3/2000 | Tripsas et al. | 257/316 |
| 6,037,625 A | 3/2000 | Matsubara et al. | 257/315 |
| 6,066,873 A * | 5/2000 | Wang et al. | 257/315 |
| 6,096,604 A * | 8/2000 | Cha et al. | 438/259 |
| 6,144,062 A * | 11/2000 | Mine et al. | 257/317 |
| 6,184,085 B1 * | 2/2001 | Jeong | 438/258 |
| 6,187,651 B1 | 2/2001 | Oh | 438/435 |
| 6,190,986 B1 | 2/2001 | Ngo et al. | 438/257 |
| 6,214,667 B1 * | 4/2001 | Ding et al. | 438/257 |
| 6,215,145 B1 * | 4/2001 | Noble | 257/315 |
| 6,222,225 B1 | 4/2001 | Nakamura et al. | 257/315 |
| 6,228,713 B1 * | 5/2001 | Pradeep et al. | 438/257 |
| 6,255,689 B1 | 7/2001 | Lee | 257/314 |
| 6,284,597 B1 * | 9/2001 | Hong | 438/257 |
| 6,291,851 B1 * | 9/2001 | Matsumoto et al. | 257/314 |
| 6,340,611 B1 * | 1/2002 | Shimizu et al. | 438/201 |
| 6,342,715 B1 * | 1/2002 | Shimizu et al. | 257/314 |
| 6,351,008 B1 | 2/2002 | Patelmo et al. | 257/315 |
| 6,369,416 B1 | 4/2002 | Hui et al. | 257/288 |
| 6,373,095 B1 | 4/2002 | Bracchitta et al. | 257/316 |
| 6,548,857 B2 * | 4/2003 | Dalla Libera et al. | 257/315 |
| 6,635,530 B2 | 10/2003 | Helm et al. | 438/257 |

FOREIGN PATENT DOCUMENTS

| | | |
|---|---|---|
| JP | 03-099473 | 4/1991 |
| JP | 3-220778 | 9/1991 |
| JP | 05-218440 | 8/1993 |
| JP | 06-188431 | 7/1994 |
| JP | 07-142598 | 6/1995 |
| JP | 11-026731 | 1/1999 |
| JP | 11-54633 | 2/1999 |
| JP | 11-087543 | 3/1999 |
| JP | 11163304 A | 6/1999 |
| JP | 11-177066 | 7/1999 |
| JP | 11-317464 | 11/1999 |
| JP | 2000-12709 | 1/2000 |
| KR | 1999-018367 | 3/1999 |

OTHER PUBLICATIONS

Kenichi Imamiya, et al., "A 130-mm2, 256-Mbit NAND Flash with Shallow Trench Isolation Technology", IEEE Journal of Solid-State Circuits, vol. 34, No. 11, Nov. 1999, pp. 1536-1543.

* cited by examiner

SEMICONDUCTOR DEVICE INCLUDING AN ELEMENT ISOLATION PORTION HAVING A RECESS

CROSS REFERENCE TO RELATED APPLICATION

This application is a divisional of U.S. application Ser. No. 10/716,556 filed on Nov. 20, 2003, now U.S. Pat. No. 6,974,746 which in turn is a divisional of U.S. application Ser. No. 09/732,723 filed on Dec. 11, 2000, now U.S. Pat. No. 6,720,610 and claims benefit of priority under 35 USC §119 to Japanese Patent Application No. Hei 11-350841 (1999), filed on Dec. 9, 1999, the entire contents of each of which are incorporated by reference herein.

BACKGROUND OF THE INVENTION

This invention relates to a nonvolatile semiconductor memory device and its manufacturing method.

There is known an electrically rewritable, nonvolatile semiconductor memory (EEPROM: electrically erasable and programmable read-only-memory) using memory cells of a stacked-gate structure stacking floating gates and control gates. This kind of EEPROM uses a tunneling insulation film as a first gate insulating film between floating gates and a semiconductor substrate and typically uses, as the second gate insulating film between floating gates and control gates, an ONO film which is a multi-layered film of a silicon oxide film (O) on a silicon nitride film (N) on a silicon oxide film (O).

Each memory cell is formed in an element-forming region partitioned by an element isolation/insulation film. In general, a floating gate electrode film is divided in the direction of control gate line (word line) by making a slit on the element isolation/insulation film. In the step of making the slit, division of floating gates in the bit-line direction is not yet done. Then a control gate electrode film is stacked via an ONO film on all surfaces of the substrate including the top of the slit-processed floating gate electrode film, and by sequentially etching the control gate electrode film, ONO film, and floating gate electrode film, control gates and floating gates are isolated in the bit-line direction. After that, source and drain diffusion layers are formed in self-alignment with the control gates.

In the above-introduced conventional EEPROM structure, floating gates of memory cells adjacent in the word-line direction are isolated on the element isolation/insulation film, but the ONO film formed thereon is continuously made in the word-line direction. It is already known that, if the isolation width (slit width) of floating gates in the word-line direction is narrowed by miniaturization of memory cells, this structure is subject to movements of electric charges through the ONO film when there is a difference in charge storage status between adjacent floating gates. This is because electric charges are readily movable in the lateral direction in the silicon nitride film or along the boundaries between the silicon nitride film and the silicon oxide films of the ONO film. Therefore, in microminiaturized EEPROM, when adjacent memory cells in the word-line direction have different data states, their threshold values vary due to movements of electric charges, and often result in destruction of data.

SUMMARY OF THE INVENTION

It is therefore an object of the invention to provide a nonvolatile semiconductor memory device improved in reliability by preventing destruction of data caused by movements of electric charges between floating gates, and also relates to its manufacturing method.

According to the first aspect of the invention, there is provided a nonvolatile semiconductor memory device comprising:

a semiconductor substrate;

a plurality of element-forming regions partitioned by element isolation/insulation films in said semiconductor substrate;

floating gates formed in said element-forming regions via a first gate insulating film and separated for individual said element-forming regions;

second gate insulating films formed on said floating gates, and divided and separated above said element isolation/insulation films;

control gates formed on said floating gates via said second gate insulating films; and source and drain diffusion layers formed in self-alignment with said control gates.

According to the second aspect of the present invention, there is provided a nonvolatile semiconductor memory device comprising:

a semiconductor substrate;

a plurality of element-forming regions partitioned by element isolation/insulation films in said semiconductor substrate;

floating gates formed in said element-forming regions via a first gate insulating film and separated for individual said element-forming regions;

a second gate insulating film formed on said floating gates to continuously extend over a plurality of element-forming regions along recesses made into surfaces of said element isolation/insulation films;

control gates formed on said floating gates via said second gate insulating film; and source and drain diffusion layers formed in self-alignment with said control gates.

According to the third aspect of the present invention, there is provided a manufacturing method of a nonvolatile semiconductor memory device, comprising the steps of:

making element isolation/insulation films that partition element-forming regions in a semiconductor substrate;

stacking a first gate electrode material film and a second gate insulating film on said semiconductor substrate via a first gate insulating film;

etching said second gate insulating film and the underlying first gate electrode material film to make slits that separate said first gate electrode material film above said element isolation/insulation films;

forming an insulating film on side surfaces of said first gate electrode material film, and thereafter stacking a second gate electrode material film;

sequentially etching said second gate electrode material film, said second gate insulating film and said first gate electrode material film to pattern said first gate electrode film into floating gates and said second gate electrode material film into control gates; and making source and drain diffusion layers in self alignment with said control gates.

According to the fourth aspect of the present invention, there is provided a manufacturing method of a nonvolatile semiconductor memory device, comprising the steps of:

making element isolation/insulation films that partition element-forming regions in a semiconductor substrate;

stacking a first gate electrode material film and a second gate insulating film on said semiconductor substrate via a first gate insulating film;

etching said second gate insulating film and the underlying first gate electrode material film to make slits that separate said first gate electrode material film above said element isolation/insulation films;

sequentially stacking a third gate insulating film and a second gate electrode material film;

sequentially etching said second gate electrode material film, said third and second gate insulating films, and said first gate electrode material film to pattern said first gate electrode material film into floating gates and said second gate electrode material film into control gates; and making source and drain diffusion layers in self-alignment with said control gates.

According to the fourth aspect of the present invention, there is provided a manufacturing method of a nonvolatile semiconductor memory device, comprising the steps of:

making element isolation/insulation films that partition element-forming regions in a semiconductor substrate;

stacking a first gate electrode material film on said semiconductor substrate via a first gate insulating film;

etching said first gate electrode material film to make slits that separate said first gate electrode material film on said element isolation/insulation films;

etching surfaces of said element isolation/insulation films exposed to said slits to make recesses;

stacking a second gate electrode material film on said first gate electrode material film and said element isolation/insulation films via said first gate insulating film;

sequentially etching said second gate electrode material film, said gate insulating film and said first gate electrode material film to pattern said first gate electrode material film into floating gates and said second gate electrode material film into control gates; and making source and drain diffusion layers in self-alignment with said control gates According to the invention, by isolating the second gate insulating film between the floating gates and the control gates in a region between adjacent memory cells via an element isolation/insulation film, electric charges are prevented from moving between adjacent floating gates via the second gate insulating film.

Furthermore, even when the second gate insulating film is not completely isolated on the device isolation film, if a recess is made on the surface of the element isolation/insulation film to have the second gate insulting film extend along the recess, it is substantially equivalent to an increase of the distance between adjacent floating gates, and here again results in preventing movements of electric charges between adjacent floating gates.

Therefore, also when memory cells are miniaturized, the invention prevents data destruction due to movements of electric charges and improves the reliability.

DESCRIPTION OF THE PREFERRED EMBODIMENTS

Explained below are embodiments of the invention with reference to the drawings.

[Embodiment 1]

Figure 1:
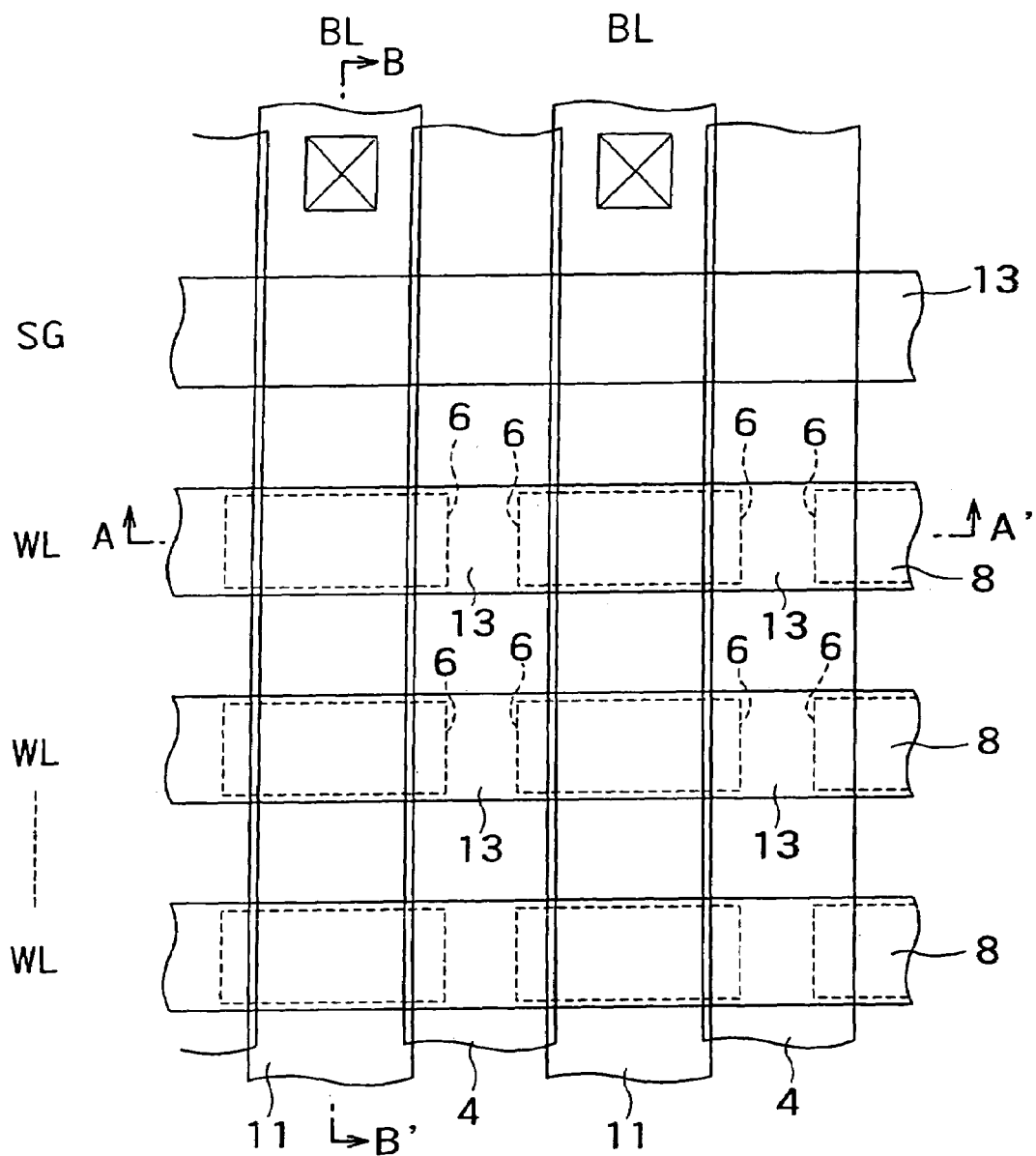
FIG. 1 is a layout of a memory cell array of EEPROM according to Embodiment 1 of the invention.
Figure 2A:
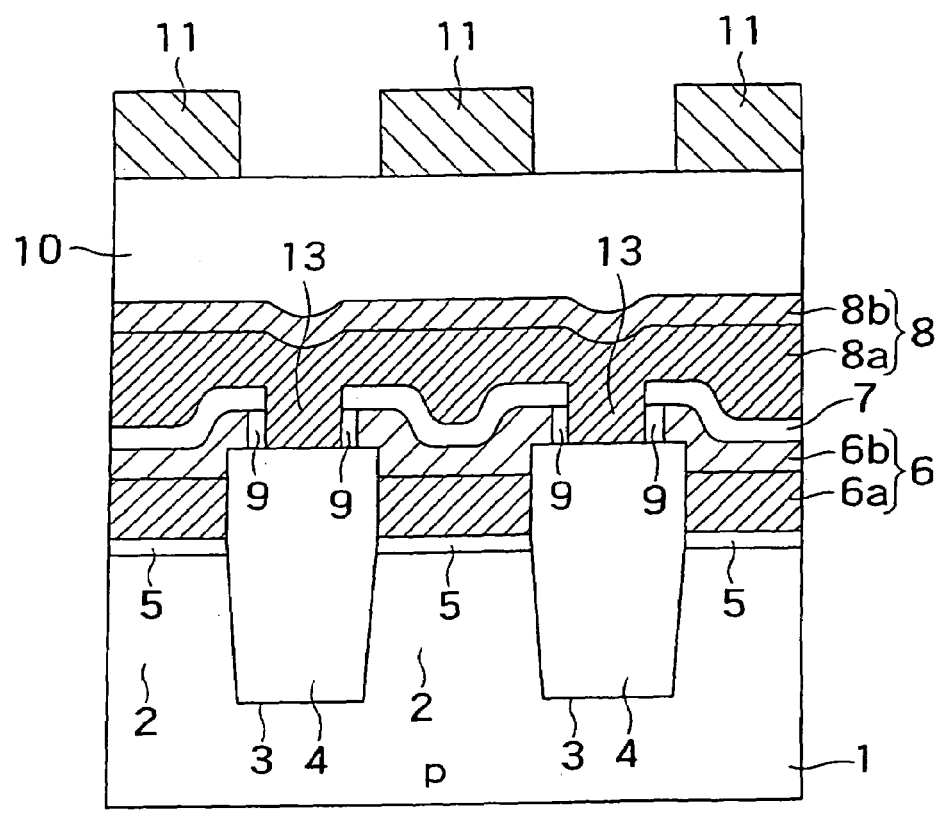
FIGS. 2A and 2B are cross-sectional views taken along the A–A' line and B–B' line of FIG. 1.
Figure 2B:
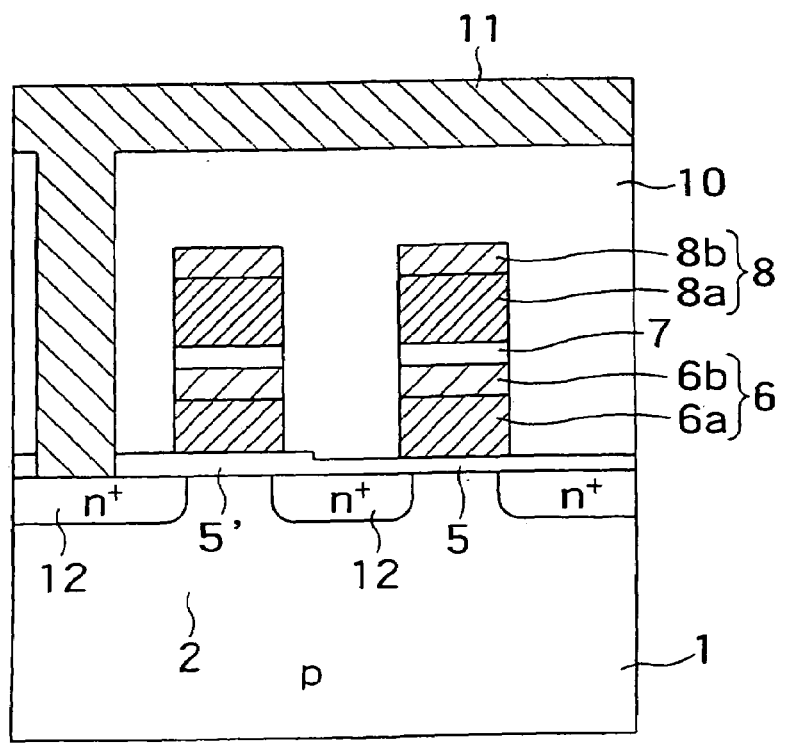

FIG. 1 is a layout of a cell array of NAND type EEPROM according to Embodiment 1 of the invention. FIGS. 2A and 2B are cross-sectional views taken along the A–A' line and B–B' line of FIG. 1.

The memory cell array is formed on a p-type well of a silicon substrate 1. The silicon substrate 1 has formed device isolation channels 3 buried with device isolation films 4 to define stripe-shaped element-forming regions 2.

In the element-forming regions 2, floating gates 6 are formed via first gate insulating films 5 as tunneling insulation films. Floating gates 6 have a two-layered structure stacking first polycrystalline silicon (or amorphous silicon)

films 6a made before isolation of devices and second polycrystalline silicon (or amorphous silicon) films 6b made after isolation of devices, and they are divided for individual memory cells. Formed on the floating gates 6 are control gates 8 via second gate insulating films 7. Control gates 8 have a two-layered structure of polycrystalline silicon (or amorphous silicon) films 8a and tungsten silicide (WSi) films 8b. The control gates 8 are patterned to continuously extend over a plurality of element-forming regions 2 in the cross-section of FIG. 2A, and they form word lines WL.

The second gate insulating films 7 between the floating gates 6 and the control gates 8 are ONO films. In this embodiment, second gate insulating films 7 are divided by slits 13 on element isolation/insulation films 4 to lie merely on floating gates 6 along word line directions in the cross-section of FIG. 2A. Therefore, on side surfaces of floating gates 6, silicon oxide films 9 are formed to isolate floating gates 6 from control gates 8.

Source and drain diffusion layers 12 are formed in self alignment with control gates 8, and a plurality of memory cells are serially connected to form NAND type cell units.

At the drain side of one-side ends of NAND type cell units, selection gates 13 formed simultaneously with control gates 8 are located, and bit lines (BL) 11 are connected to their drain diffusion layers. The selection gates 13 portion has the same multi-layered gate structure as the gate portions of memory cells, but the first gate electrode material film in that portion is not isolated as floating gates, and two layers integrally form selection gates 13 short-circuited at predetermined positions. In the selection gates 13 portion, the first gate insulating film 5' is thicker than that of the memory cell region. Although not shown, the other end source side of the NAND cell units is made in the same manner as the drain side.

A specific manufacturing process of EEPROM according to the embodiment is explained with reference to FIG. 3A and 3B through FIGS. 8A and 8B, which are cross-sectional views corresponding to FIGS. 2A and 2B, under different stages of the process.

Figure 3A:
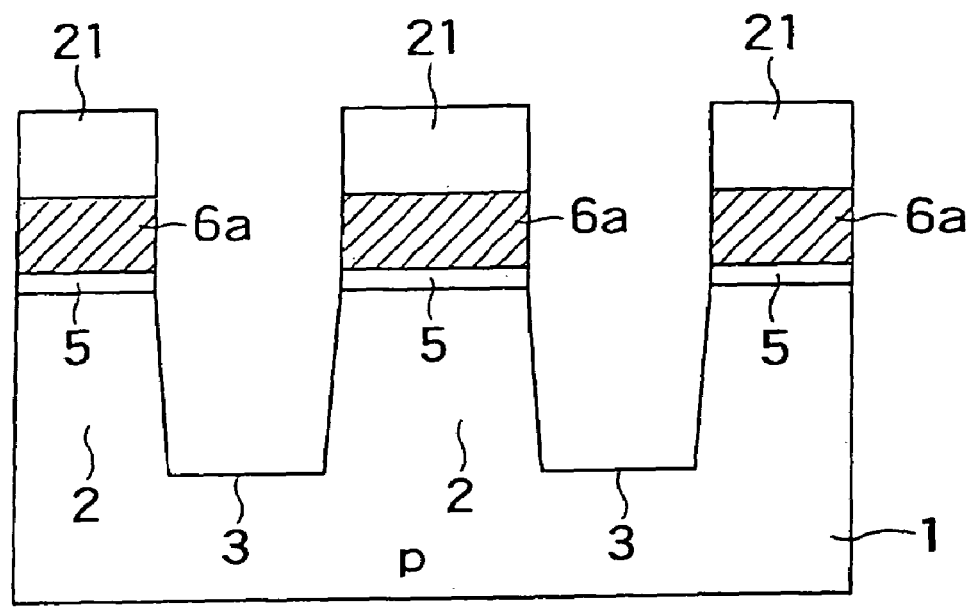
FIGS. 3A and 3B are cross-sectional views for showing a manufacturing process of Embodiment 1.
Figure 3B:
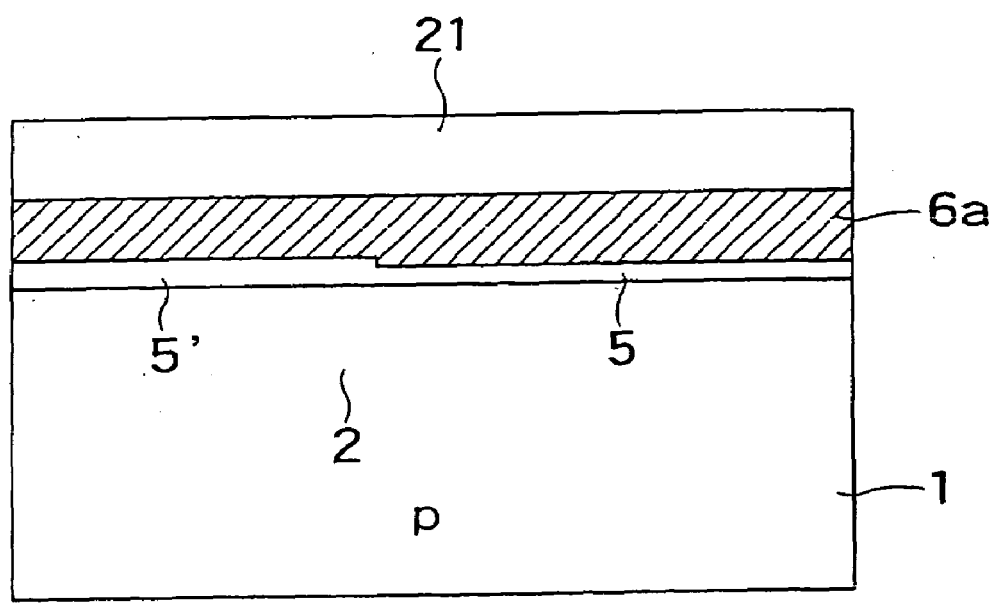

As shown in FIGS. 3A and 3B, first stacked on a silicon substrate 1 is a 10 nm thick silicon oxide film as the first gate insulating film 5, a 60 nm thick first polycrystalline silicon film 6a, which is a gate electrode material film, is next stacked thereon, and a mask material 21 is further stacked for device isolation processing. In the region for the gate transistors, a gate insulating film 5' thicker than that of the region for cell transistors. The mask material 21 is a multi-layered film stacking a silicon nitride film and a silicon oxide film. The mask material 21 is patterned and left only in element-forming regions, and by using it, the polycrystalline silicon film 6a, first gate insulating film 5, 5' are etched, and the substrate 1 is additionally etched, to form device-isolating grooves 3.

Figure 4A:
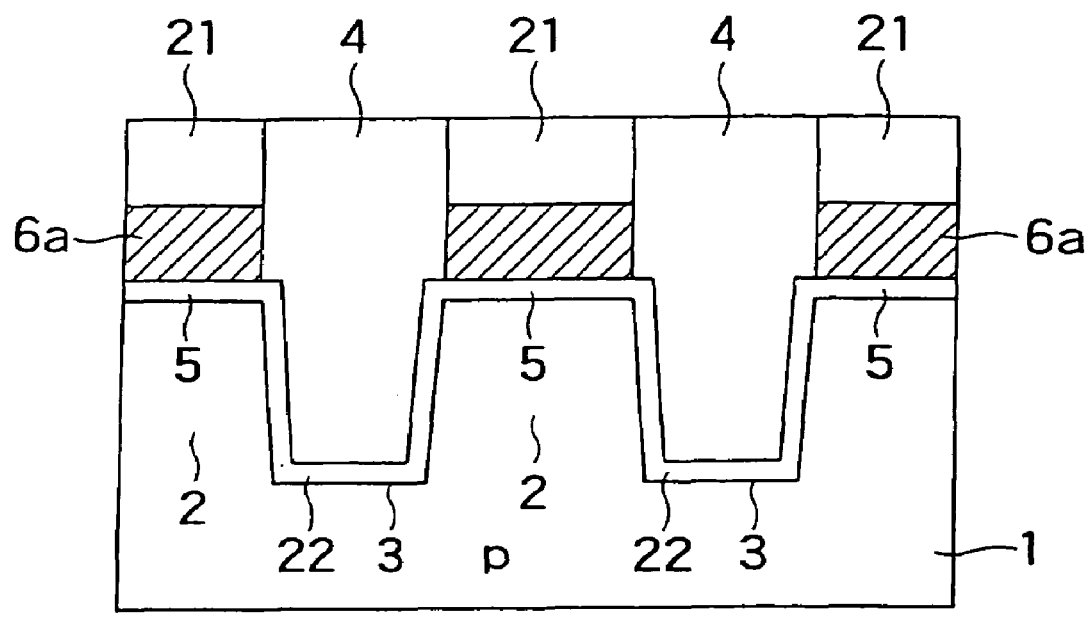
FIGS. 4A and 4B are cross-sectional views for showing the manufacturing process of Embodiment 1.
Figure 4B:
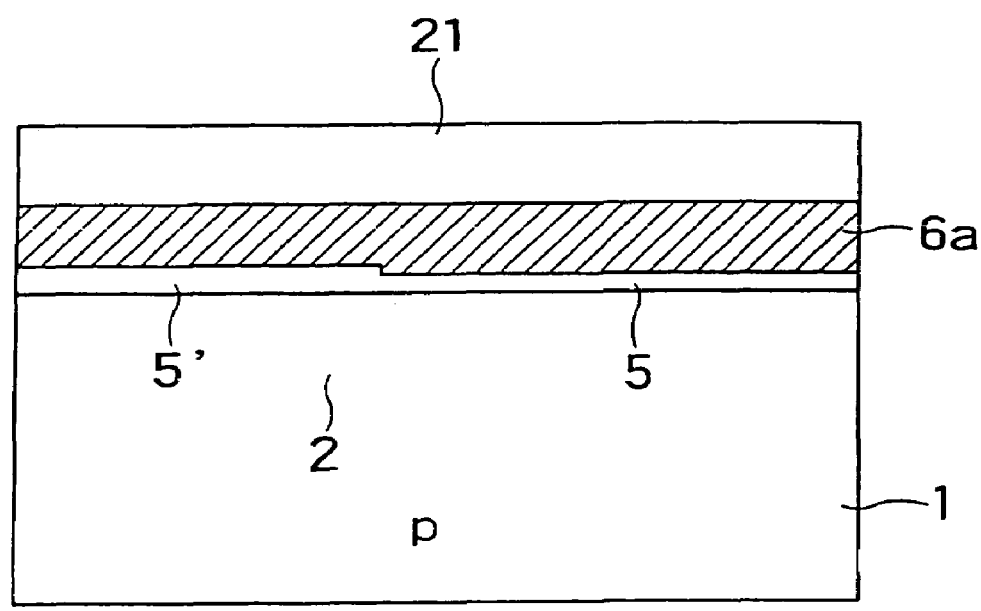

After that, it is annealed in an $O_2$ atmosphere at 1000° C. to create a silicon oxide film 22 of about 6 nm on inner walls of the device-isolating grooves 3 as shown in FIGS. 4A and 4B. Subsequently, a silicon oxide film is stacked by plasma CVD and then smoothed by CMP so as to bury it as element isolation/insulation films 4 in the device-isolating grooves 3. Then, after annealing it in a nitrogen atmosphere at 900° C., the mask material 21 is removed. Removal of the silicon nitride film relies on phosphoric-acid treatment at 150° C.

Figure 5A:
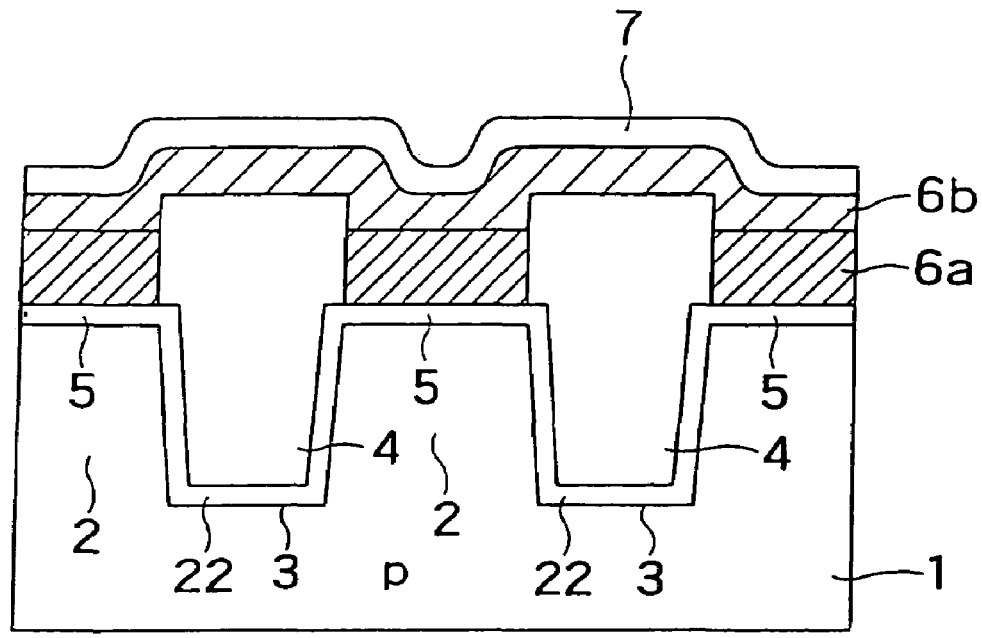
FIGS. 5A and 5B are cross-sectional views for showing the manufacturing process of Embodiment 1.
Figure 5B:
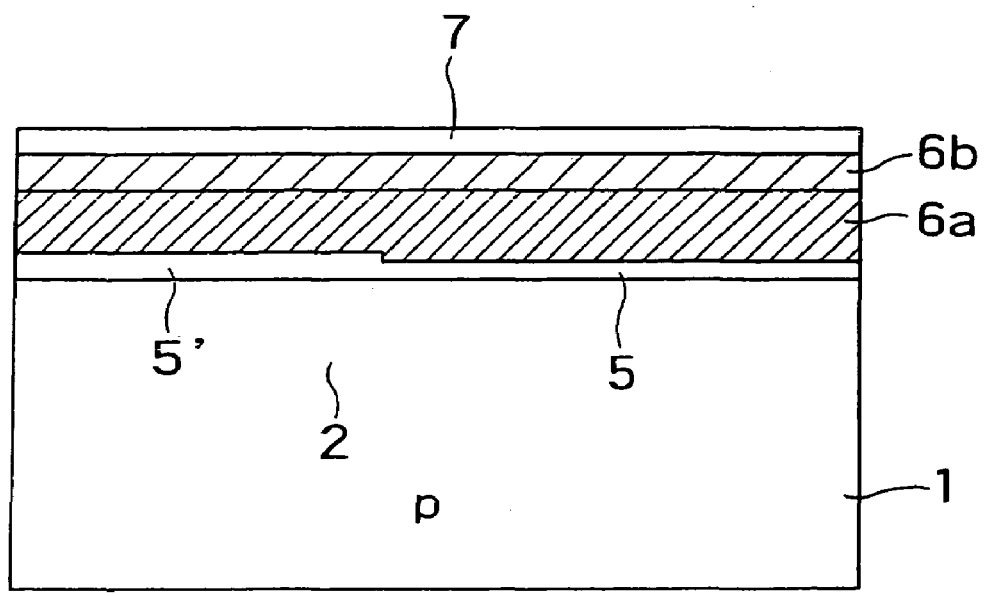

After that, as shown in FIGS. 5A and 5B, the second polycrystalline silicon film 6b doped with phosphorus is stacked by low-pressure CVD, and an ONO film to be used as the second gate insulating film 7 is stacked successively.

Figure 6A:
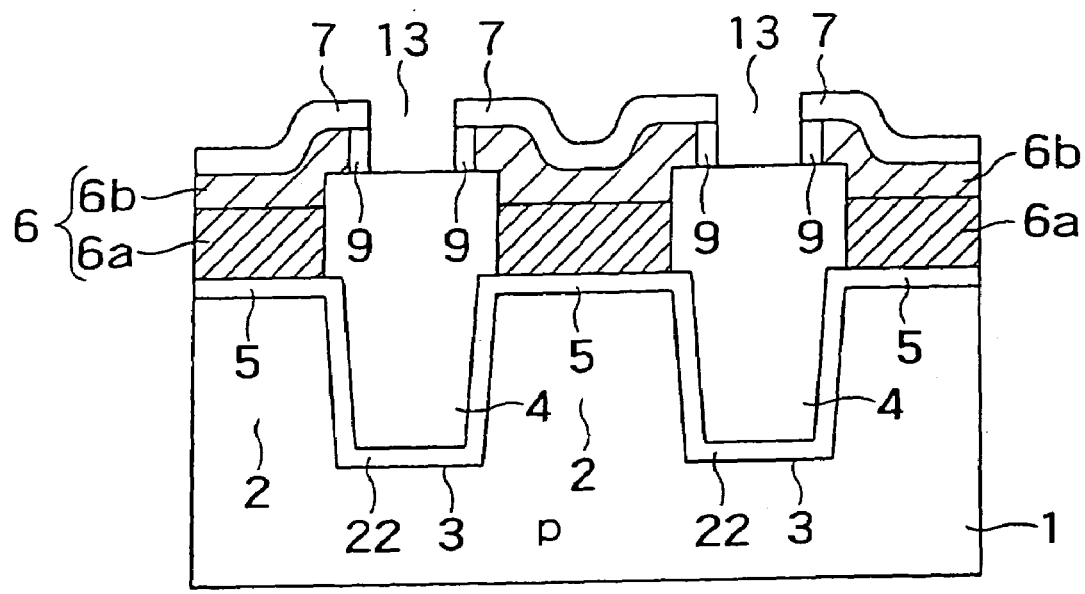
FIGS. 6A and 6B are cross-sectional views for showing the manufacturing process of Embodiment 1.
Figure 6B:
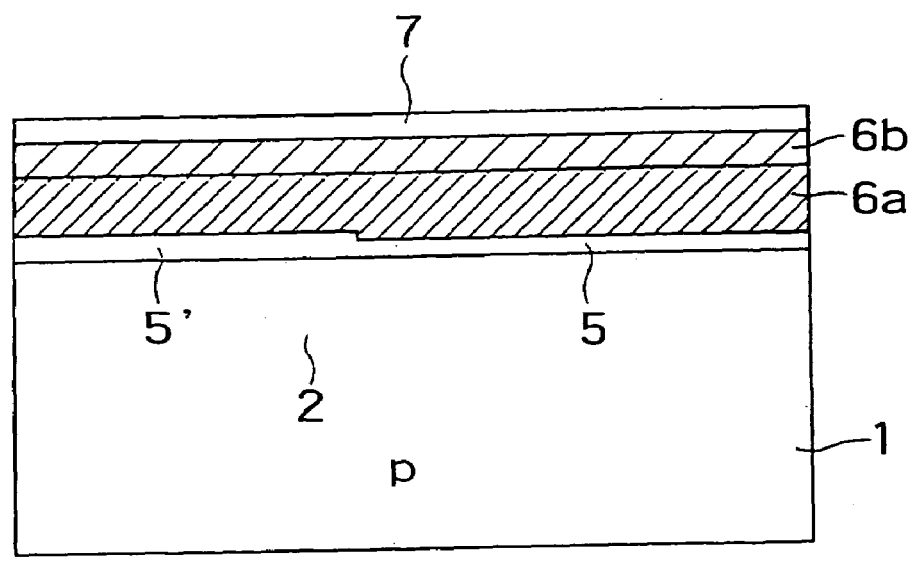

Then, using a resist pattern having apertures on element isolation/insulation films 4 as a mask, the second gate insulating film 7 and the second polycrystalline silicon film 6b are etched by RIE to make slits 13 that isolate floating gates 6 on element isolation/insulation films 4 as shown in FIGS. 6A and 6B. The slits 13 have a length enough to extend through a plurality of memory cells in the NAND cell unit. Differently from prior art techniques, the second gate insulating film 7 is simultaneously isolated by slits 13 on the element isolation/insulation films 4.

Figure 7A:
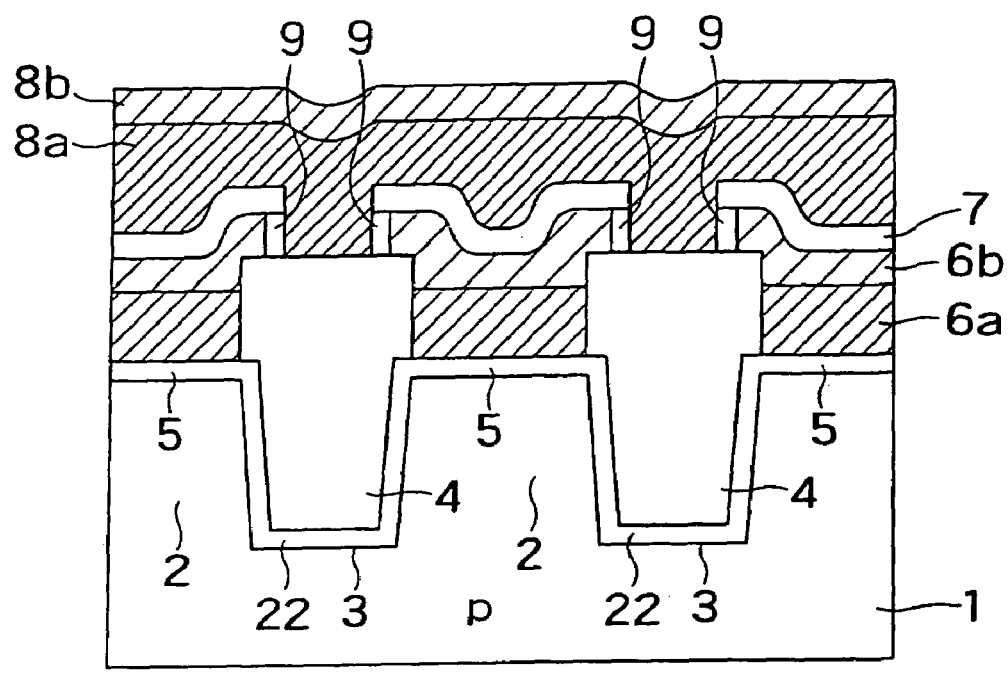
FIGS. 7A and 7B are cross-sectional views for showing the manufacturing process of Embodiment 1.
Figure 7B:
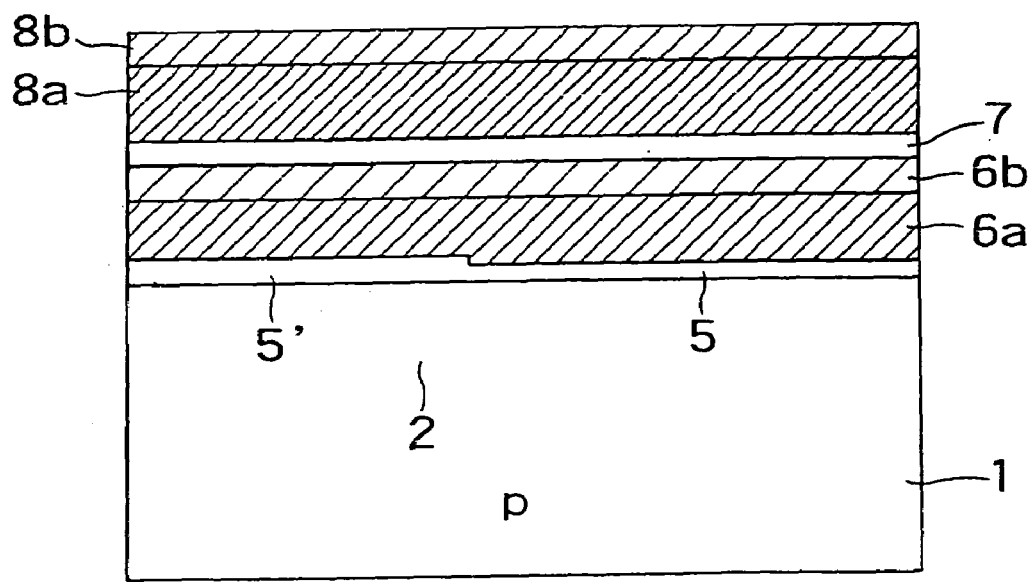
Figure 8A:
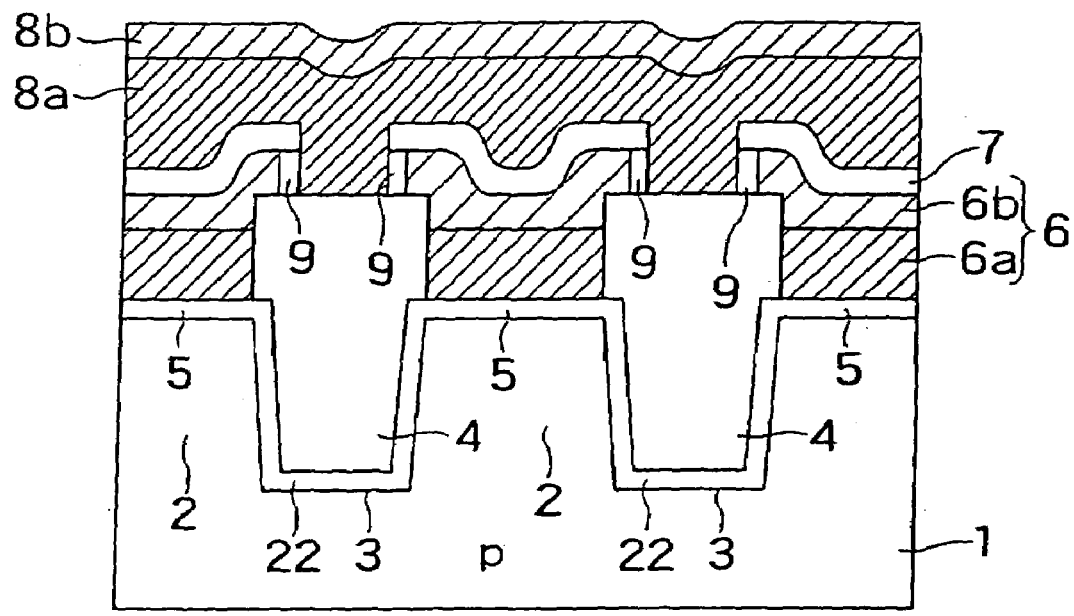
FIGS. 8A and 8B are cross-sectional views for showing the manufacturing process of Embodiment 1.
Figure 8B:
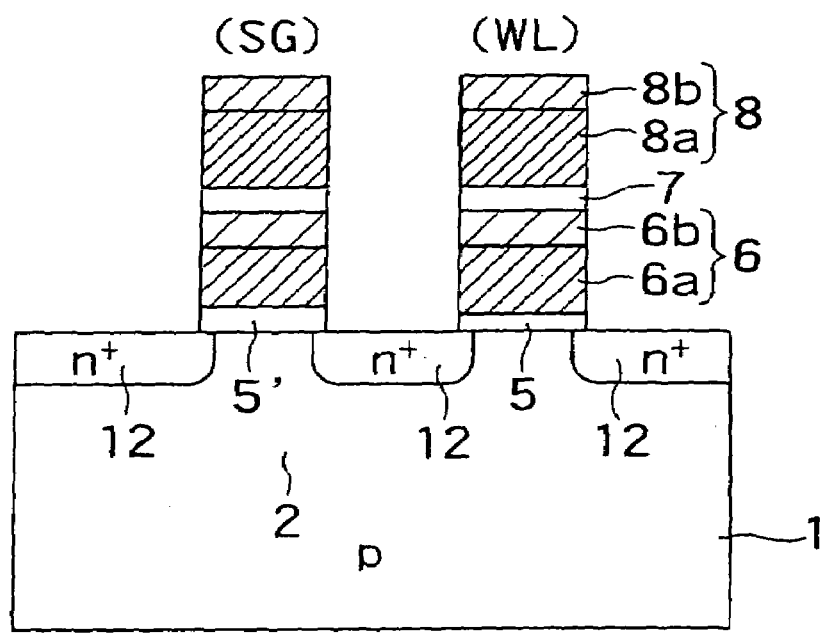
Figure 9A:
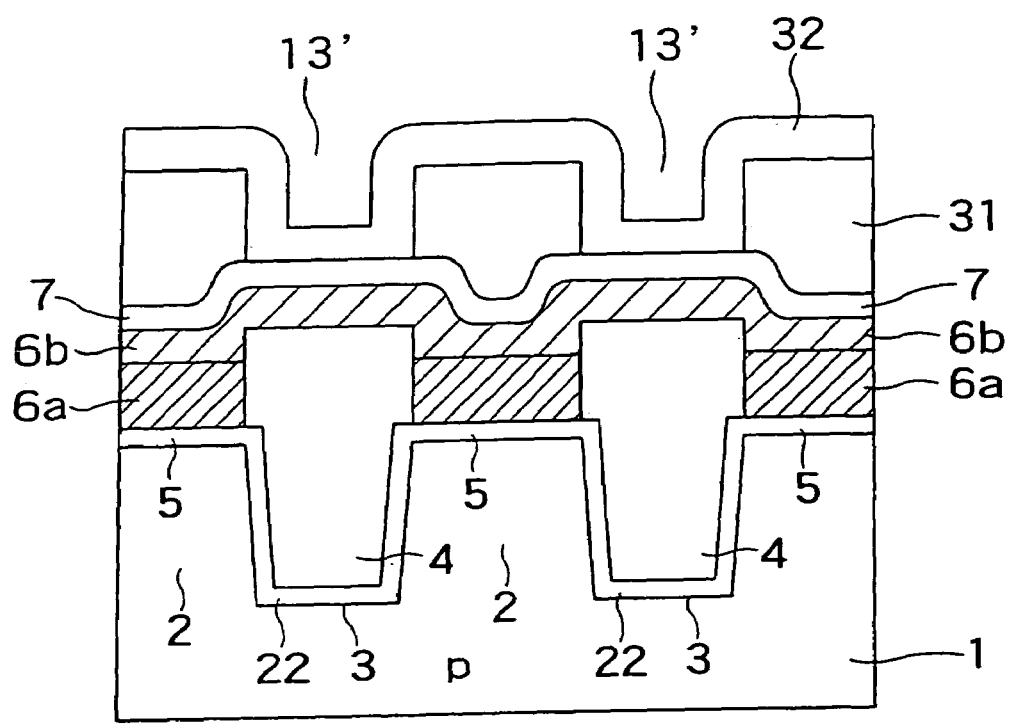
FIGS. 9A and 9B are cross-sectional views for showing a manufacturing process of Embodiment 2 of the invention.
Figure 9B:
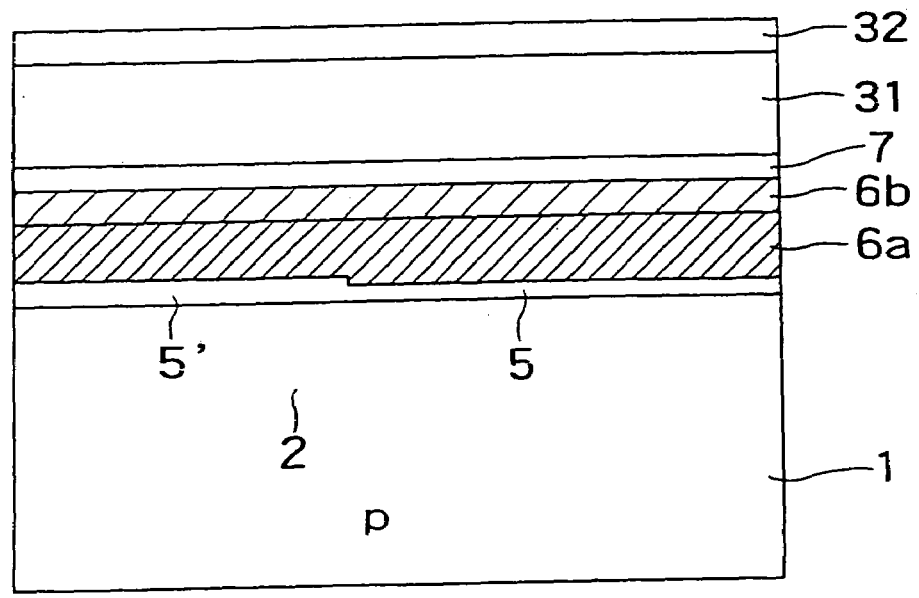

Side surfaces of the polycrystalline silicon film 6b exposed by formation of slits 13 are protected by heating the structure in an O2 atmosphere at 1000° C. and thereby creating a silicon oxide film 9. After that, as shown in FIGS. 7A and 7B, a polycrystalline silicon film 8a dopes with phosphorus is stacked as the gate electrode material film by CVD, and a WSi film 8b is successively stacked thereon.

A resist is next applied and patterned, and the WSi film 8b, polycrystalline silicon film 8a, gate insulating film 7, polycrystalline silicon films 6b, 6b, and gate insulating film 5 are sequentially etched to make control gates 8 in the pattern of continuous word lines WL, and divide the floating gates 6 into discrete forms in the bit-line direction. Thereafter, by ion implantation, source and drain diffusion layer 12 in self-alignment with the control gates 8 are formed for individual memory cells.

As to the selection gate line SG, the lower gate electrode material films 7a, 6b are not divided on the element isolation/insulation films 4, but they are continuously patterned integrally with the upper gate electrode material films 8a, 8b.

Thereafter, as shown in FIGS. 2A and 2B, an inter-layer insulating film 10 is stacked, contact holes are made, and bit lines 11 are stacked and patterned.

As explained above, according to the embodiment, the second gate electrode material film in form of ONO film on floating gates 6 is divided simultaneously with the floating gates 6 on the element isolation/insulation films 4. Therefore, even in a structure where floating gates of adjacent memory cells are closely located, leakage of electric charges does not occur, and data is reliably kept in each memory cell.

[Embodiment 2]

FIGS. 9A and 9B through FIG. 12A and 12B show a manufacturing process according to another embodiment. Parts or elements corresponding to those of the former embodiment are labeled with the common reference numerals, and their detailed explanation is omitted. Also in this embodiment, the second gate insulating film 7 in form of ONO film on the floating gates 6 is divided on the element isolation/insulation films 4, but its process is different from the former embodiment.

Figure 10A:
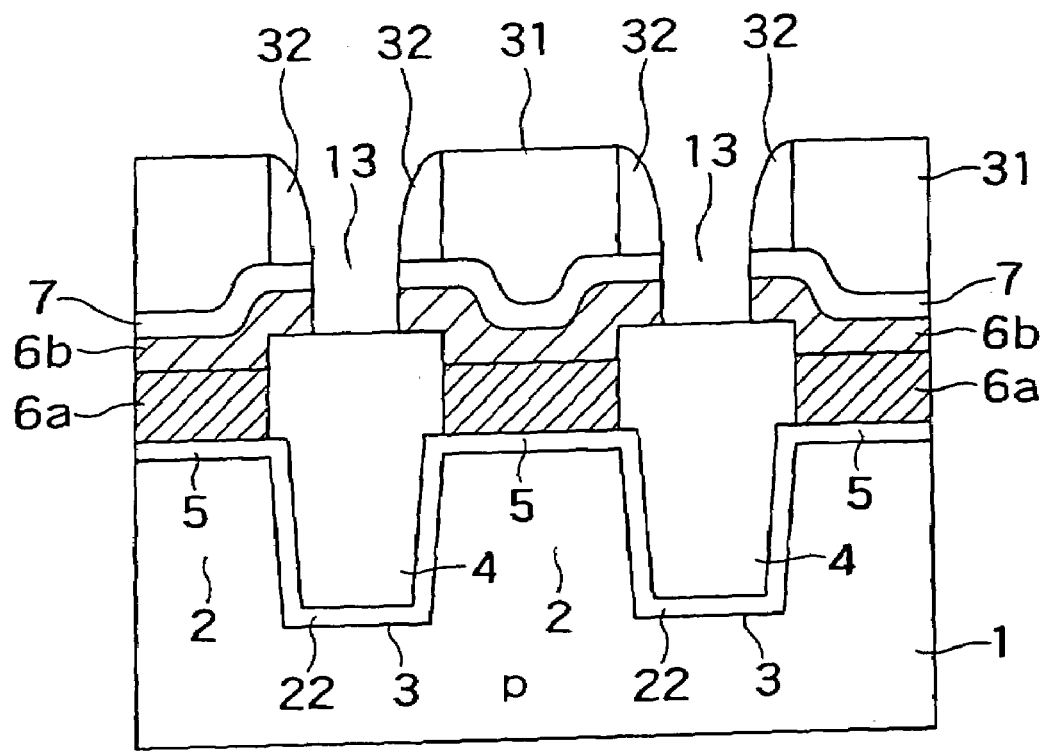
FIGS. 10A and 10B are cross-sectional views for showing the manufacturing process of Embodiment 2.
Figure 10B:
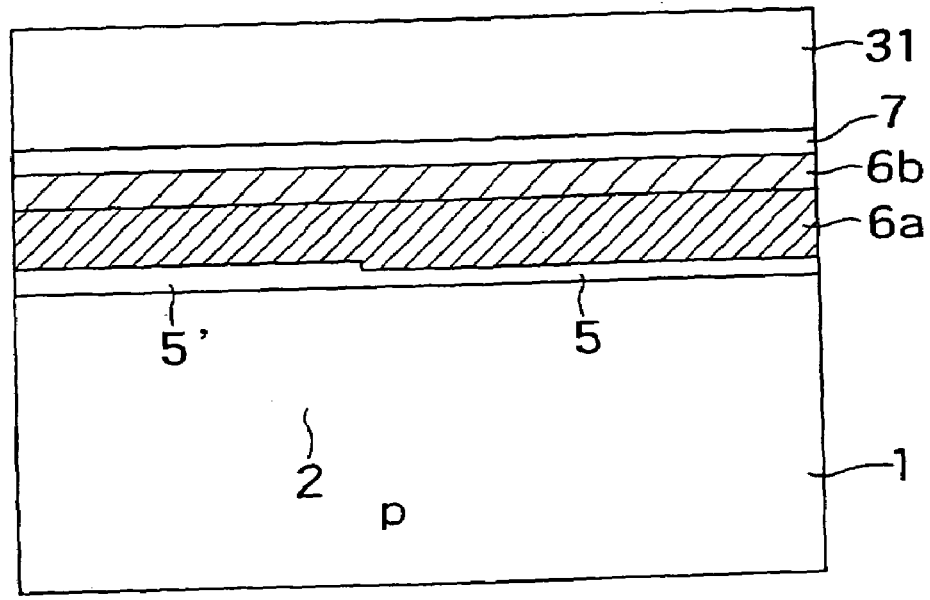

Up to the step shown in FIGS. 5A and 5B, the process is the same as that of the former embodiment. After that, as show in FIGS. 9A and 9B, a silicon oxide film 31 is stacked on the second gate insulating film 7, and slit-making apertures 13' are opened on the element isolation/insulation films 4. Further stacked thereon a silicon oxide film 32. It then undergoes etching-back to be maintained side spacers only in the apertures 13' as shown in FIGS. 10A and 10B. In this status, using the silicon oxide films 31, 32 as a mask, the second gate insulating film 7 and the polycrystalline silicon film 6b are etched by RIE. As a result, similarly to the former embodiment, slits 13 are made to divide the second gate insulating film 7 and the polycrystalline silicon film 6b on the element isolation/insulation film4 into discrete portions.

Figure 11A:
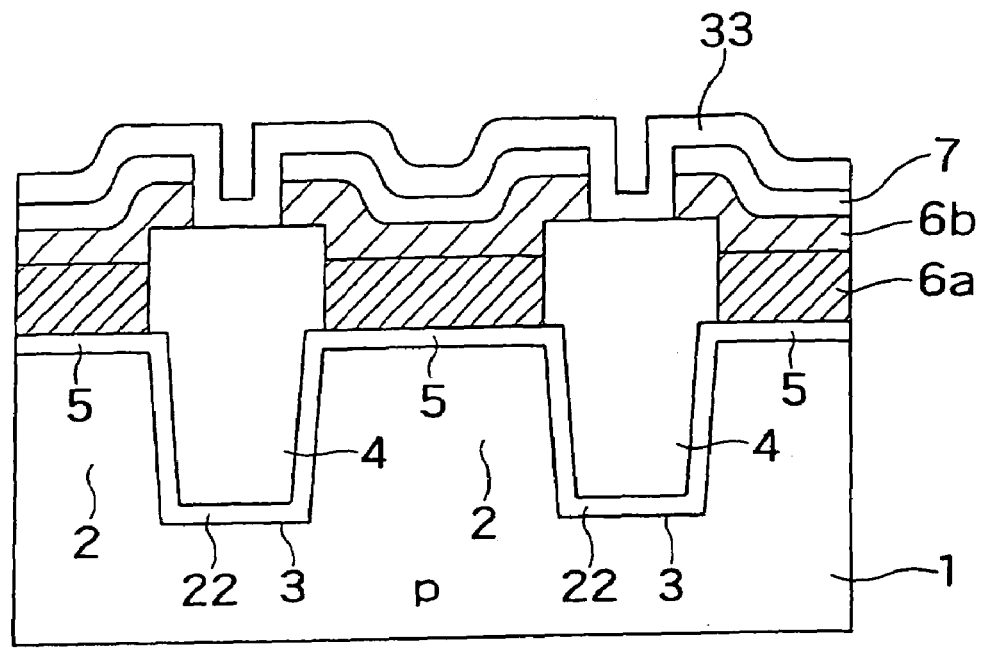
FIGS. 11A and 11B are cross-sectional views for showing the manufacturing process of Embodiment 2.
Figure 11B:
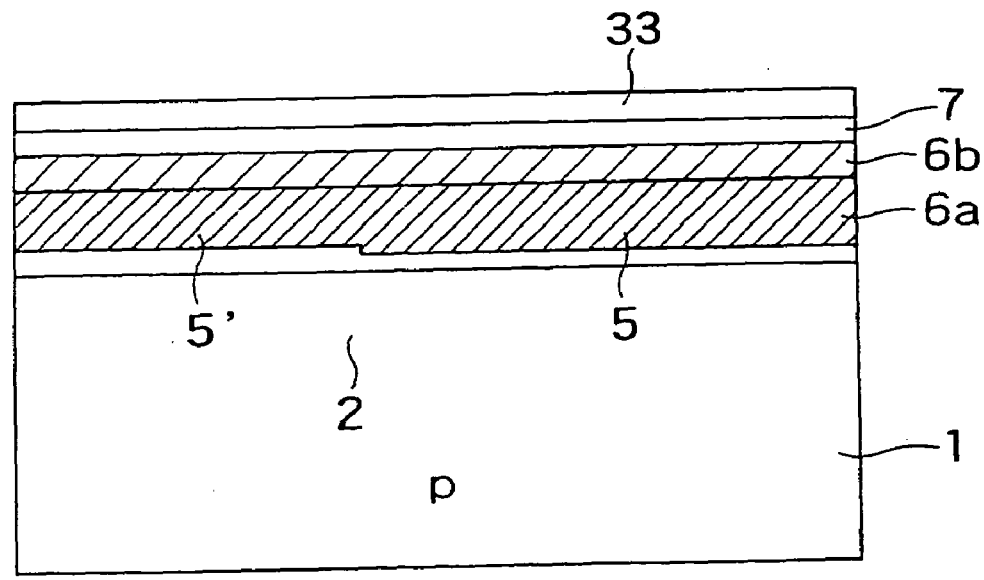

Subsequently, after removing the silicon oxide films 31, 32 by HF, a silicon oxide film 33 is stacked on the entire surface by low-pressure CVD as shown in FIGS. 11A and 11B.

This silicon oxide film 33, after deposition, is heated in an O₂ atmosphere at 1000° C. and thereby changed to a compact oxide film without movements of electric charges, or the like. The silicon oxide film 33, as well as the second gate insulating film 7, functions as a gate insulating film, and functions as an insulating film that protects side surfaces of the polycrystalline silicon film 6b.

Figure 12A:
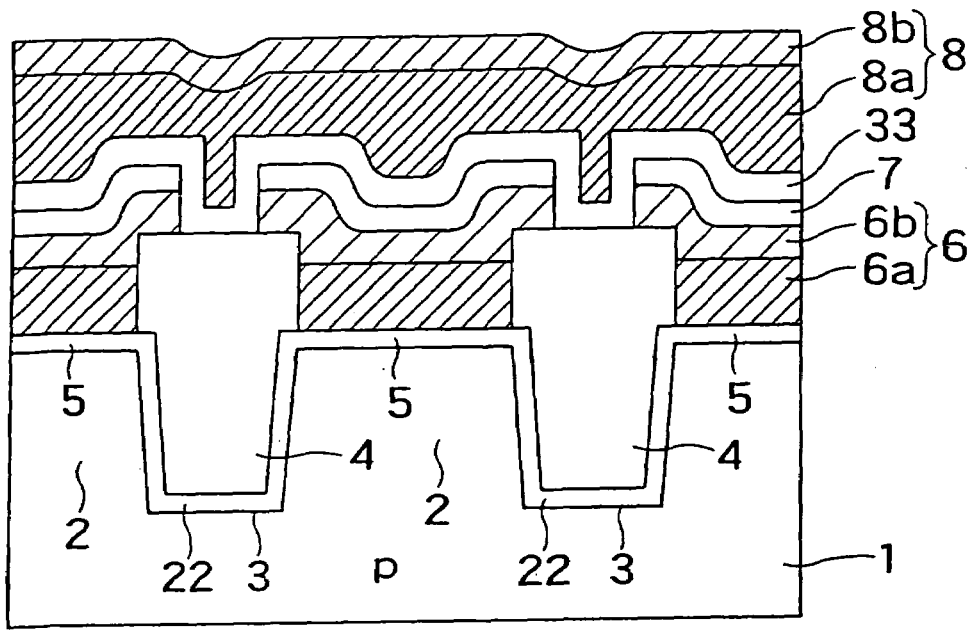
FIGS. 12A and 12B are cross-sectional views for showing the manufacturing process of Embodiment 2.
Figure 12B:
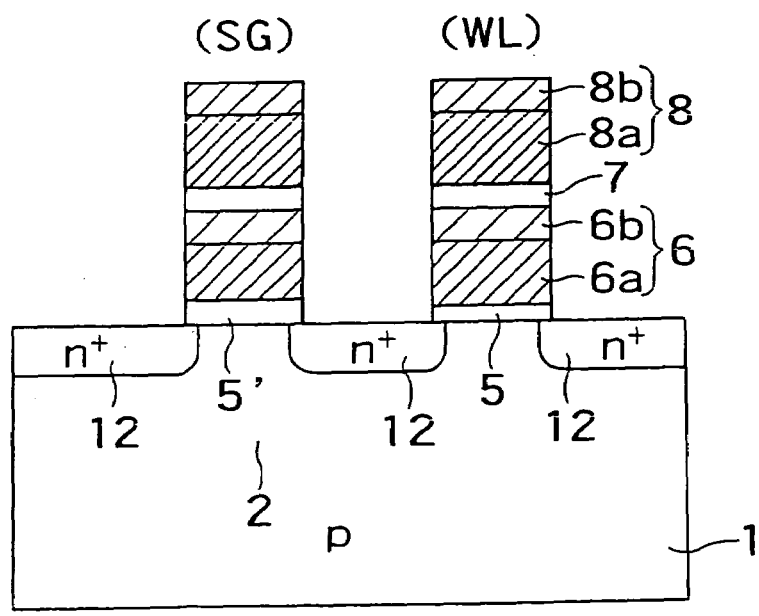

After that, as shown in FIGS. 12A and 12B, the polycrystalline silicon film 8a and the WSi film 8b are sequentially stacked, then patterned in the same manner as the foregoing embodiment to form control gates 8 and floating gates 6 and the source drain diffusion layers 12 are made.

Also in this embodiment, similarly to the foregoing embodiment, the gate insulating film is cut and separated at device-isolating regions. Therefore, excellent data holding property is obtained.

[Embodiment 3]

Figure 13A:
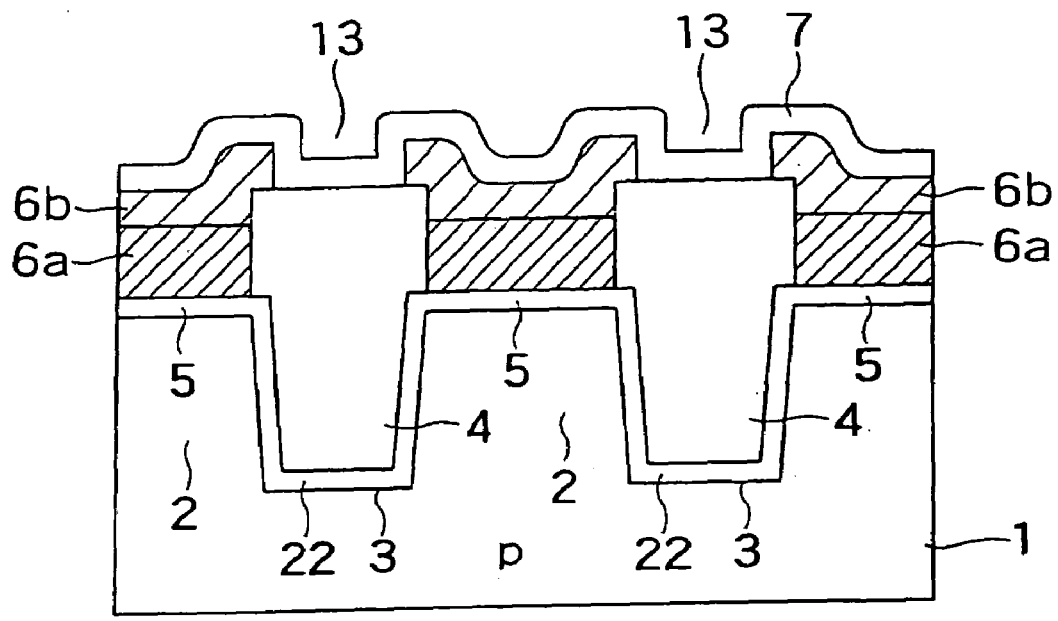
FIGS. 13A and 13B are cross-sectional views for showing a manufacturing process of Embodiment 3 of the invention.
Figure 13B:
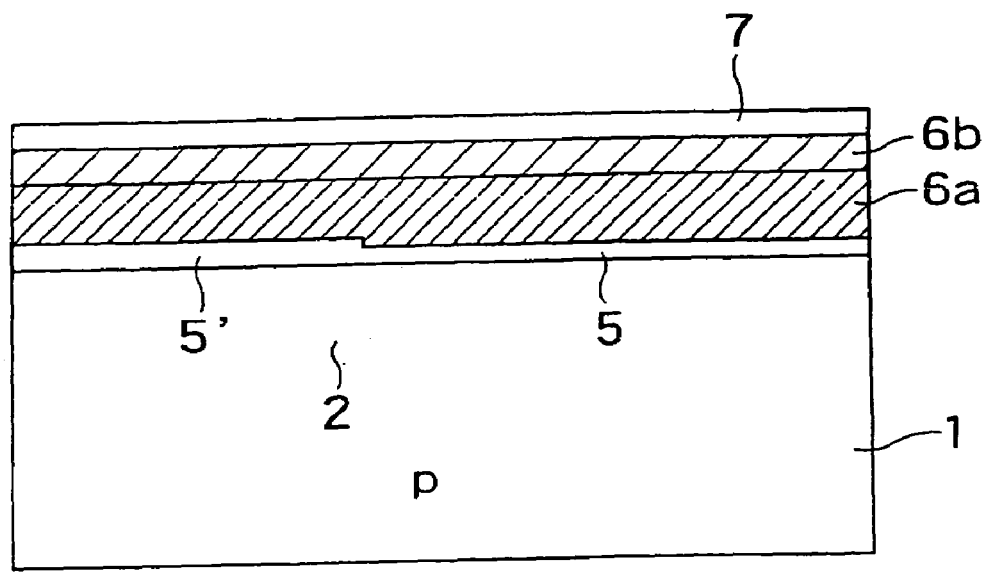
Figure 14A:
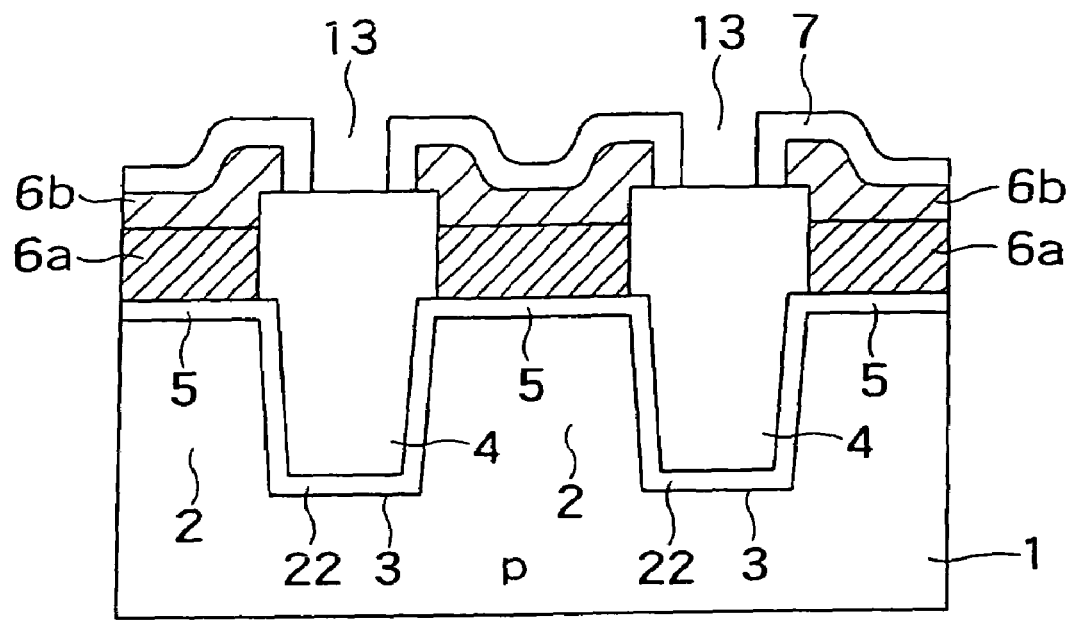
FIGS. 14A and 14B are cross-sectional views for showing the manufacturing process of Embodiment 3.
Figure 14B:
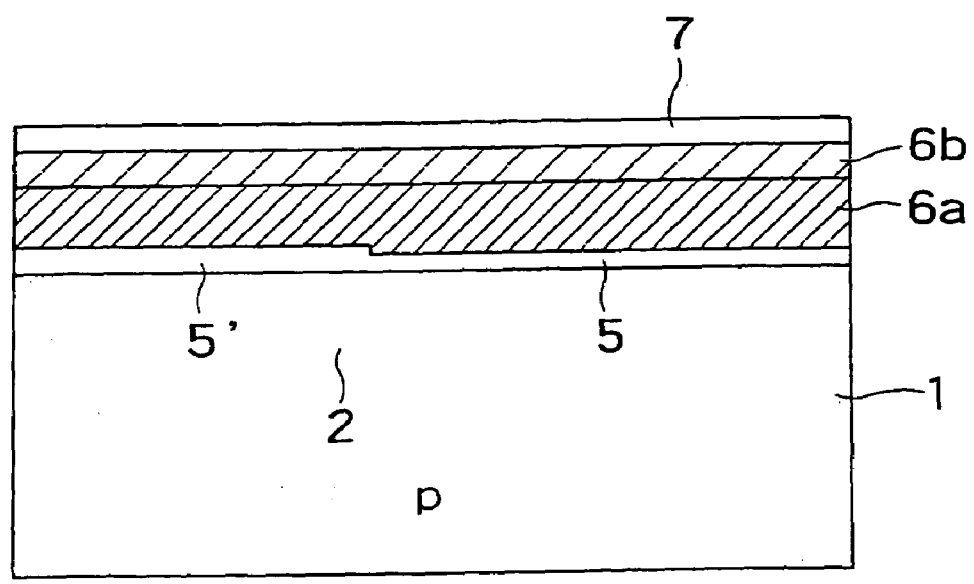
Figure 15A:
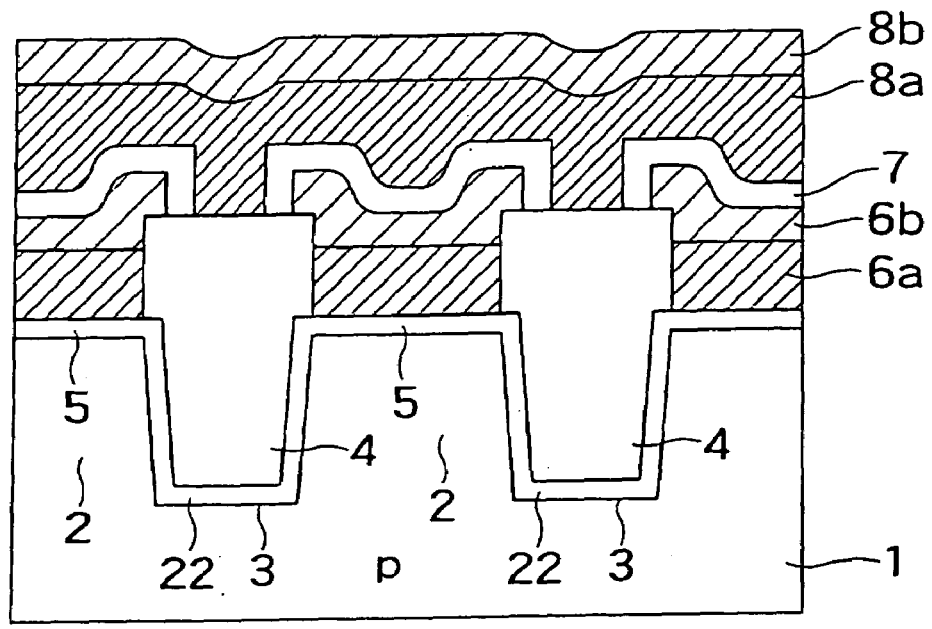
FIGS. 15A and 15B are cross-sectional views for showing the manufacturing process of Embodiment 3.
Figure 15B:
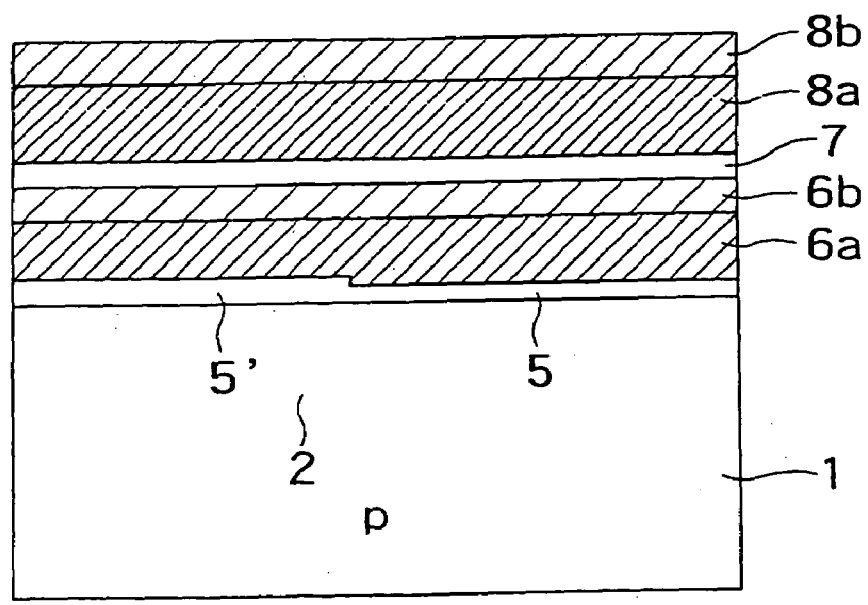
Figure 16A:
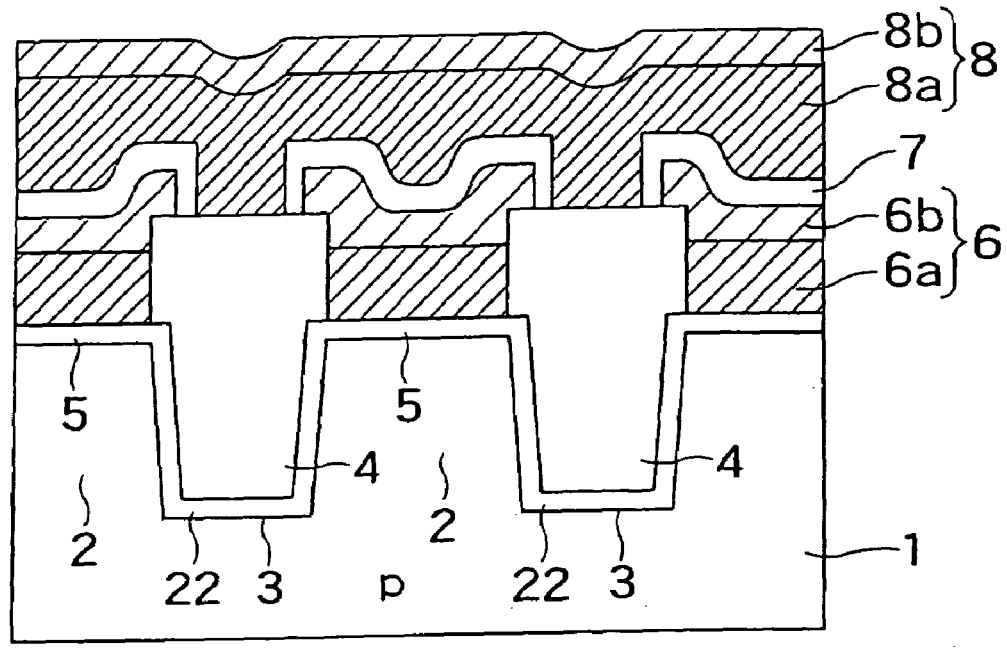
FIGS. 16A and 16B are cross-sectional views for showing the manufacturing process of Embodiment 3.
Figure 16B:
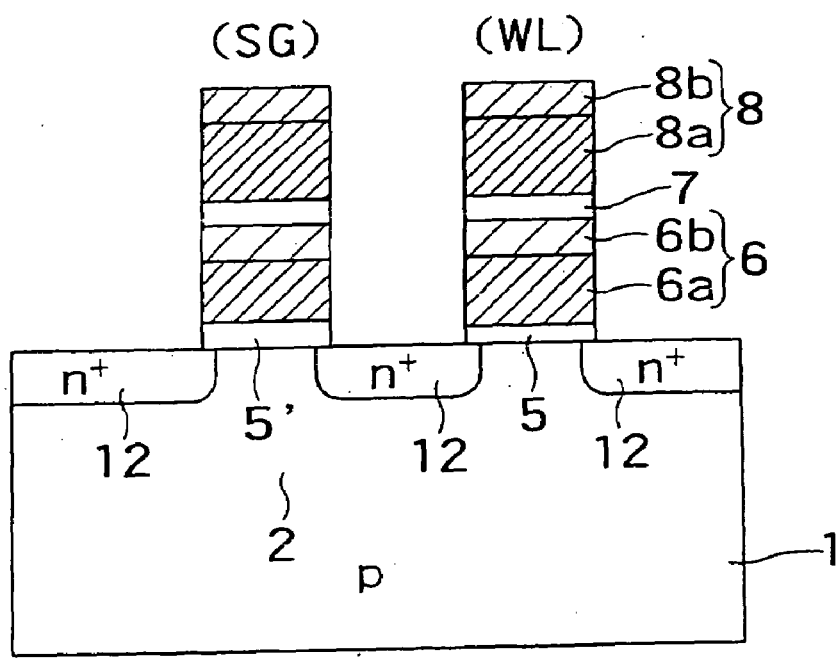

FIGS. 13A, 13B through FIGS. 16A, 16B show a manufacturing process according to a still another embodiment. Although the former embodiment, as shown in FIGS. 5A and 5B, sequentially stacked the second-layer polycrystalline silicon film 6b and the second gate insulating film 7, the embodiment shown here stacks makes slits 13 for separating the second-layer polycrystalline silicon film 6b above the element isolation/insulation films 4 before stacking the second gate insulating film 7 as shown in FIGS. 13A and 13B. The second gate insulating film 7 is stacked thereafter. Then, a resist pattern (not shown) having the same apertures as the slits 13 is applied on the second gate insulating film 6b, and the second gate insulating film 6b is etched by RIE and separated at portions of the slits 13 as shown in FIGS. 14A and 14B. After that, in the same manner as the former embodiment, the phosphorus-doped polycrystalline silicon film 8a is stacked as a gate electrode material film by CVD, and the WSi film 8b is successively stacked thereon.

Subsequently, by providing a pattern of a resist, the WSi film 8b, polycrystalline silicon film 8a, gate insulating film 7, polycrystalline silicon films 6b, 6a and gate insulating film 5 are sequentially etched by RIE so as to pattern the control gate 8 into continuous word lines WL and simultaneously separate the floating gate 6 into discrete memory cells in the bit-line direction. Then, by introducing ions, source and drain diffusion layers 12 for respective memory cells are made in self-alignment with the control gates8.

This embodiment also separates the second gate insulating film 7 on the floating gates 6 above the element isolation/insulation films 4, and provides excellent data-holding property equivalent to the former embodiments.

[Embodiment 4]

All embodiments explained heretofore cut and separate the second gate insulating film 7 above the element isolation/insulation films 4. The instant embodiment, however, is intended to obtain substantially the same effect without cutting and separating it. Cross-sectional aspects of this embodiment are shown in FIGS. 17A and 17B, which correspond to FIGS. 2A and 2B.

Figure 17A:
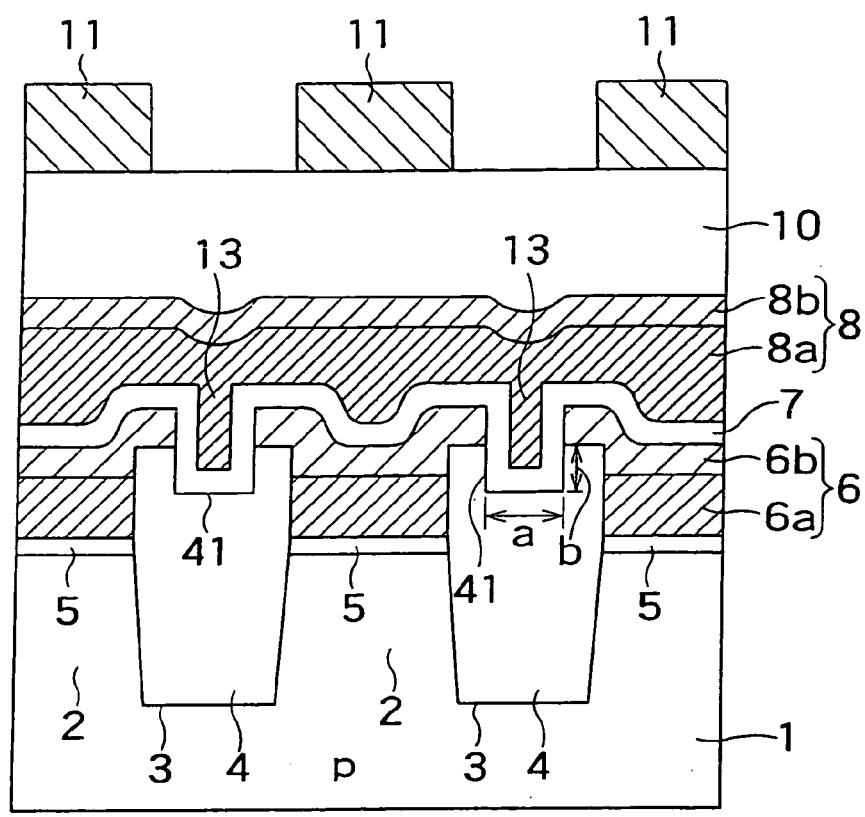
FIGS. 17A and 17B are cross-sectional views of EEPROM according to the fourth embodiment of the invention, which correspond to FIGS. 2A and 2B.
Figure 17B:
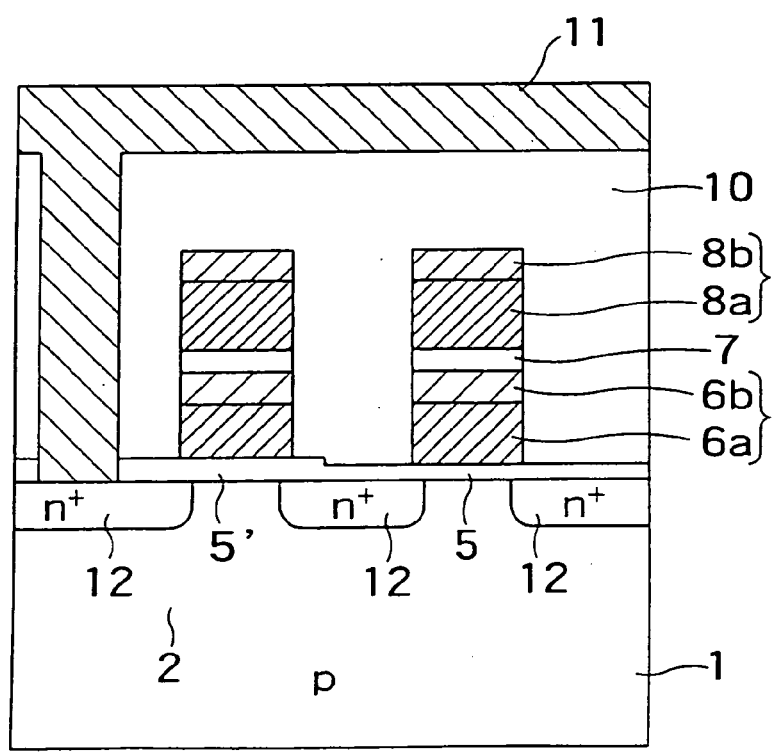

The structure shown in FIGS. 17A and 17B is different from that of FIGS. 2A and 2B in making slits 13 for separating the floating gate 6 above the element isolation/insulation films 4 prior to stacking the second gate insulating film 7 and simultaneously conducting recess-etching of the element isolation/insulation films 4 to make recesses 41. Therefore, the first gate insulating film 7 is disposed along the recesses formed on surfaces of the element isolation/insulation films 4.

As shown in FIG. 17A, assigning a to the width of each slit 13 and hence the width of each recess 41 formed into each element isolation/insulation film 4, and b to the depth of each recess 41, distance between adjacent floating gates is substantially a+2b. By adjusting this distance to a value diminishing movements of electric charges between floating gates to a negligible value, excellent data-holding property equivalent to that of the foregoing embodiments can be obtained.

Figure 18:
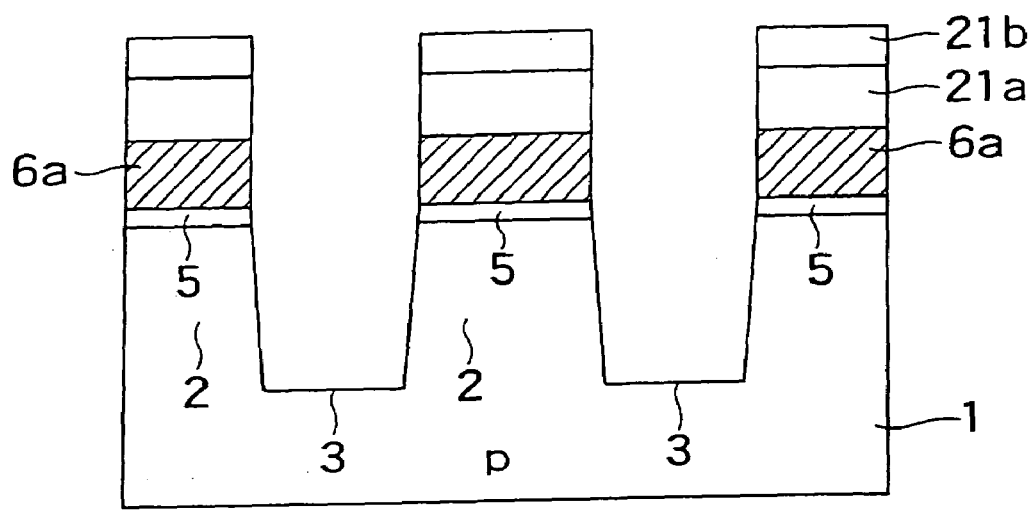
FIGS. 18 is a cross-sectional view for showing the manufacturing process of Embodiment 4.

A specific manufacturing process according to this embodiment is explained with reference to FIGS. 18 through 25, taking the cross-section of FIG. 17A into account. As shown in FIG. 18, a silicon oxide film, approximately 8 nm thick, is formed as the first gate insulating film 5 on a silicon substrate 1, and the first polycrystalline silicon film 6a is stacked thereon up to a thickness around 60 nm by low-pressure CVD. Successively, a 150 nm thick silicon nitride film 21a and a 165 nm thick silicon oxide film 21b are stacked by low-pressure CVD.

Subsequently, after conducting oxidation by combustion of hydrogen at 850° C. for 30 minutes, a resist pattern is formed to cover the device-isolating regions by lithography, and the silicon oxide film 21b and the silicon nitride film 21a are etched by RIE to make a patterned mask. Using this mask, the polycrystalline silicon film 6a and the gate insulating film 5 are etched by RIE, and the silicon substrate 1 is additionally etched, thereby to make the device isolating grooves 3. As a result, stripe-shaped element-forming regions 2 are defined.

Figure 19:
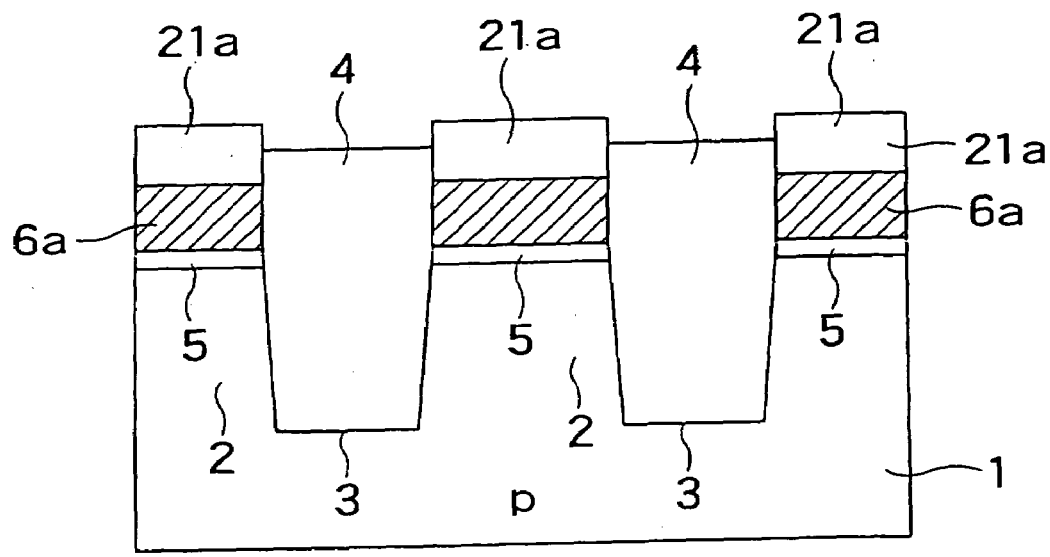
FIG. 19 is a cross-sectional view for showing the manufacturing process of Embodiment 4.
Figure 20:
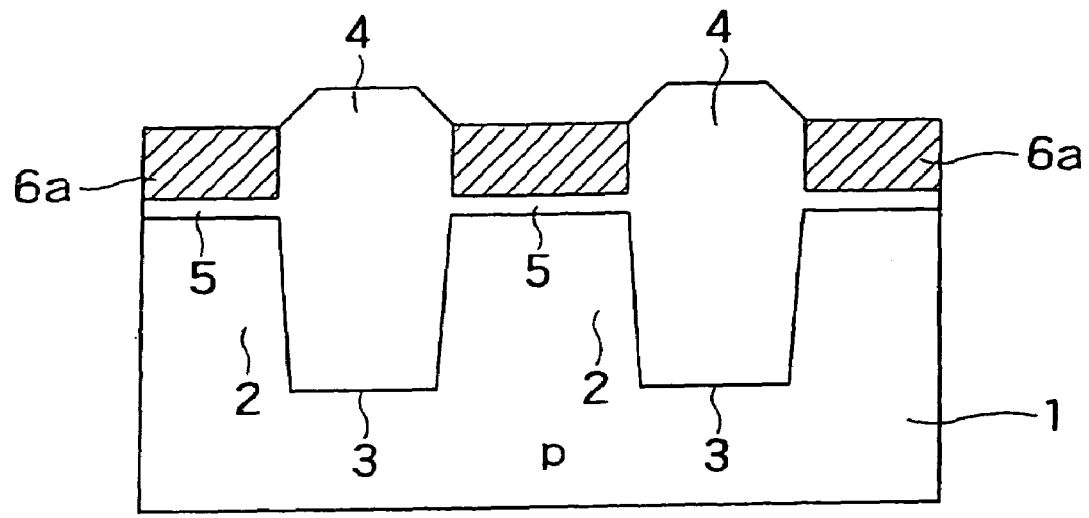
FIG. 20 is a cross-sectional view for showing the manufacturing process of Embodiment 4.

Subsequently, after making a thermal oxide film on sidewalls of the device isolating grooves 3, a silicon oxide film 4 is stacked by plasma CVD, and then flattened by CMP, thereby to bury the device isolating grooves 3 with it as shown in FIG. 19. The silicon oxide film 21b is removed by buffering fluoric acid, and the silicon nitride film 21a is removed by treatment using phosphoric acid at 150° C. for 30 minutes, thereby to obtain the state of FIG. 20.

Figure 21:
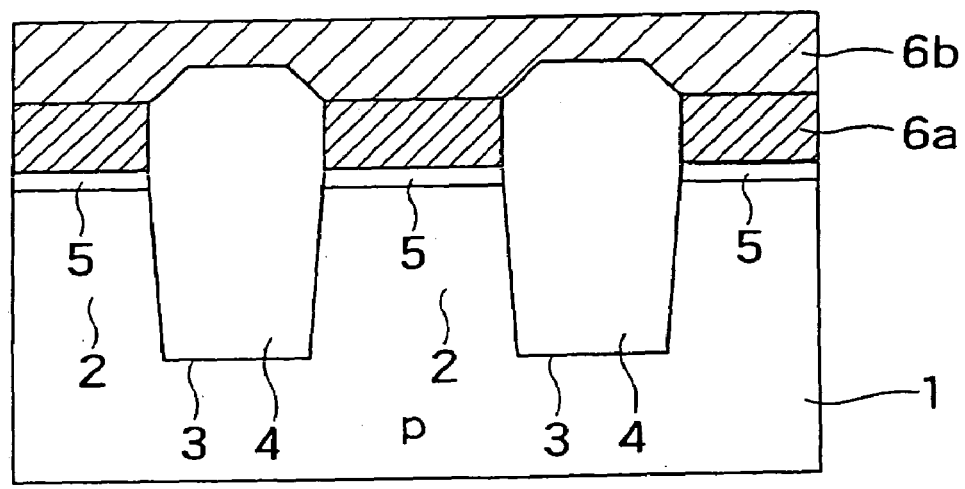
FIG. 21 is a cross-sectional view for showing the manufacturing process of Embodiment 4.
Figure 22:
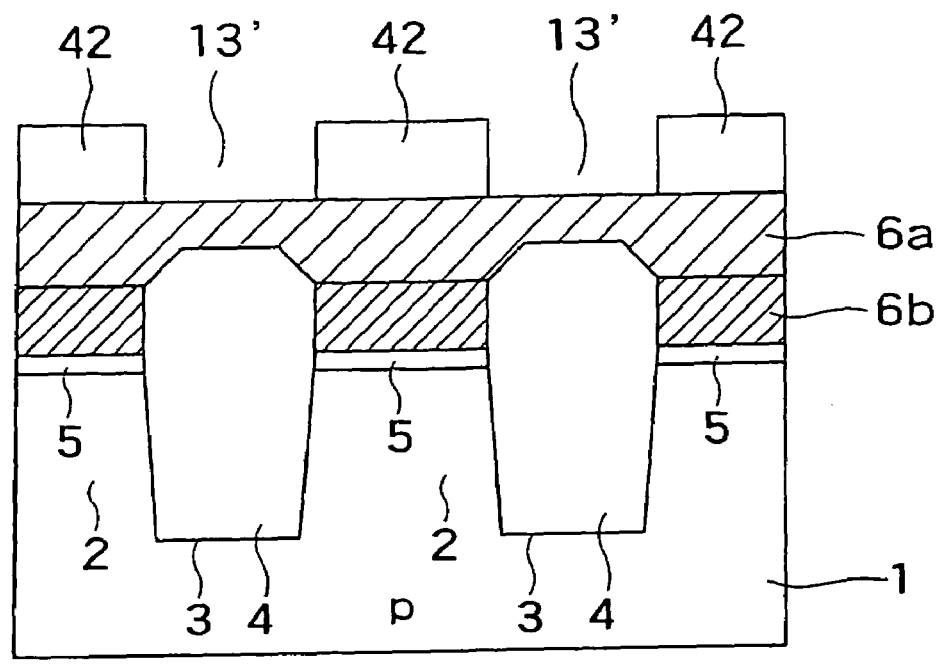
FIG. 22 is a cross-sectional view for showing the manufacturing process of Embodiment 4.
Figure 23:
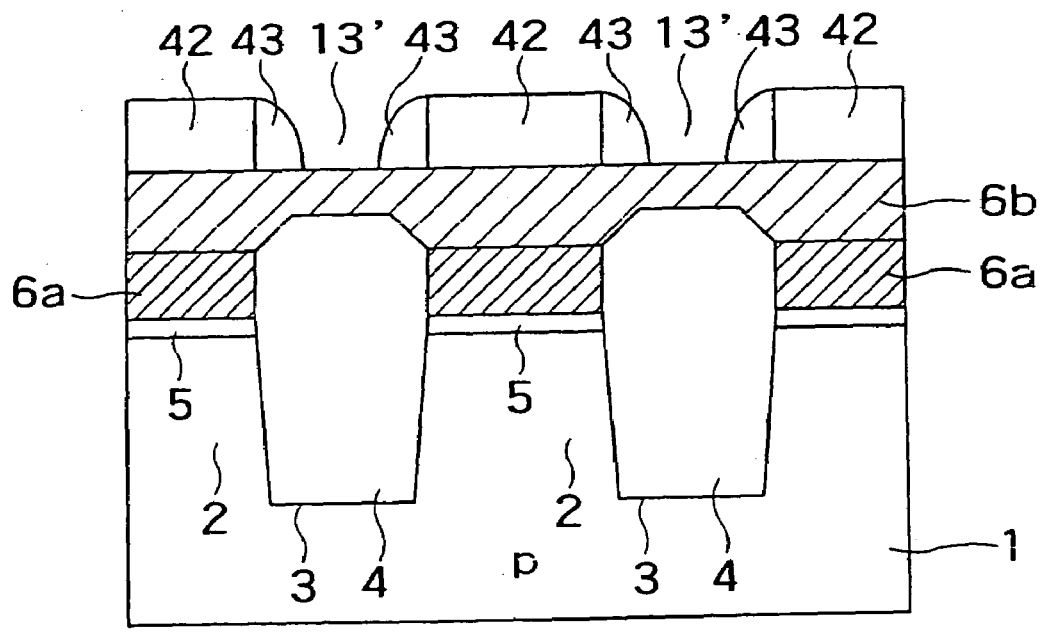
FIG. 23 is a cross-sectional view for showing the manufacturing process of Embodiment 4.

After that, as shown in FIG. 21, the second polycrystalline silicon film 6b, 100 nm thick, is stacked by low-pressure CVD. After that, as shown in FIG. 22, a silicon oxide film 42 is stacked to a thickness around 230 nm by low-pressure CVD, and through lithography and RIE, apertures 13' for making slits are made. Further, as shown in FIG. 23, a silicon oxide film 43, approximately 70 nm thick, is stacked by low-pressure CVD, and by an etch-back process, it is maintained as side spacers only on side walls of the apertures 13'.

Figure 24:
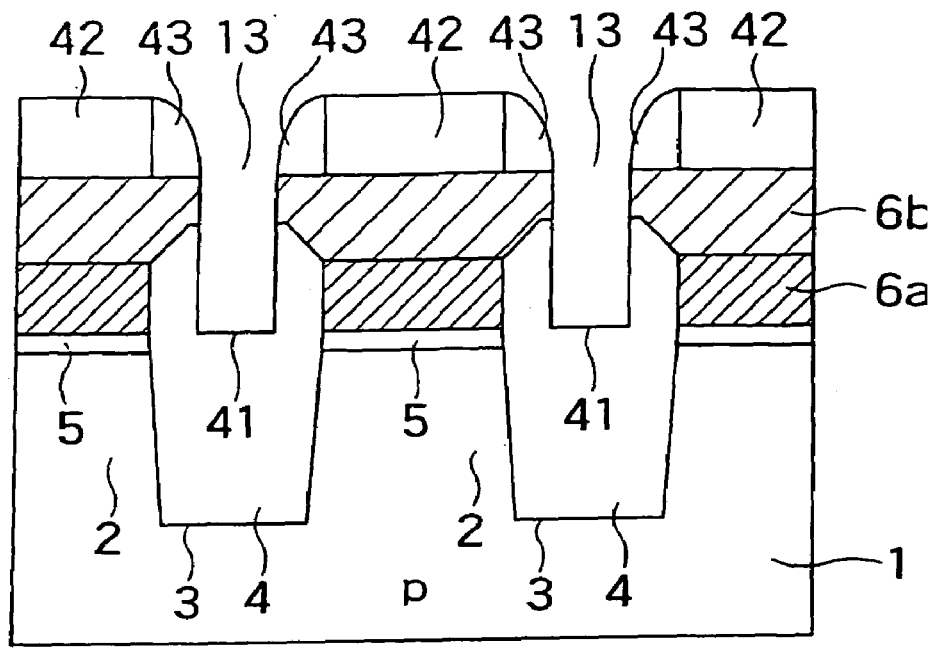
FIG. 24 is a cross-sectional view for showing the manufacturing process of Embodiment 4.

After that, using the silicon oxide films 42, 43 as a mask, the polycrystalline silicon film 6b is etched by RIE to make slits 13 for isolating floating gates, as shown in FIG. 24. Furthermore, surface of the element isolation/insulation film 4 is etched by RIE having a large selectivity relative to the polycrystalline silicon, thereby to make recesses 41 of the same width as that of slits 13 in the element isolation/insulation film 4.

Figure 25:
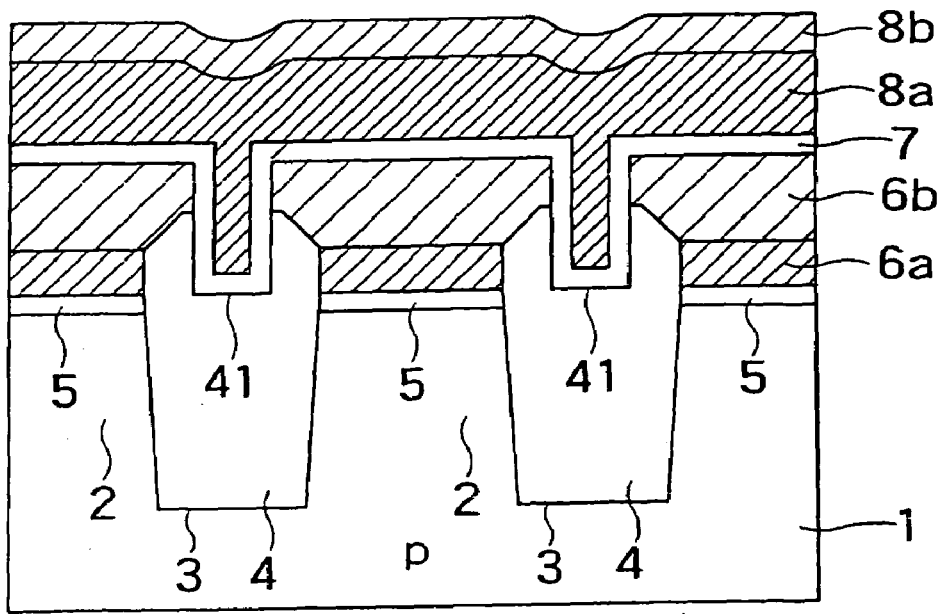
FIG. 25 is a cross-sectional view for showing the manufacturing process of Embodiment 4.

Subsequently, after removing the silicon oxide films 42, 43 by treatment using O₂ plasma and HF, the second gate insulating film 7 in form of 17 nm thick ONO film is stacked as shown in FIG. 25, and successively thereafter, a 100 nm thick third polycrystalline silicon film 8a by low-pressure CVD and a 50 nm thick WSi film 8b by plasma CVD are sequentially stacked.

Thereafter, although not shown, through the same steps as those of the foregoing embodiments, gate portions are divided into discrete memory cells, and source and drain diffusion layers are formed.

Figure 26:
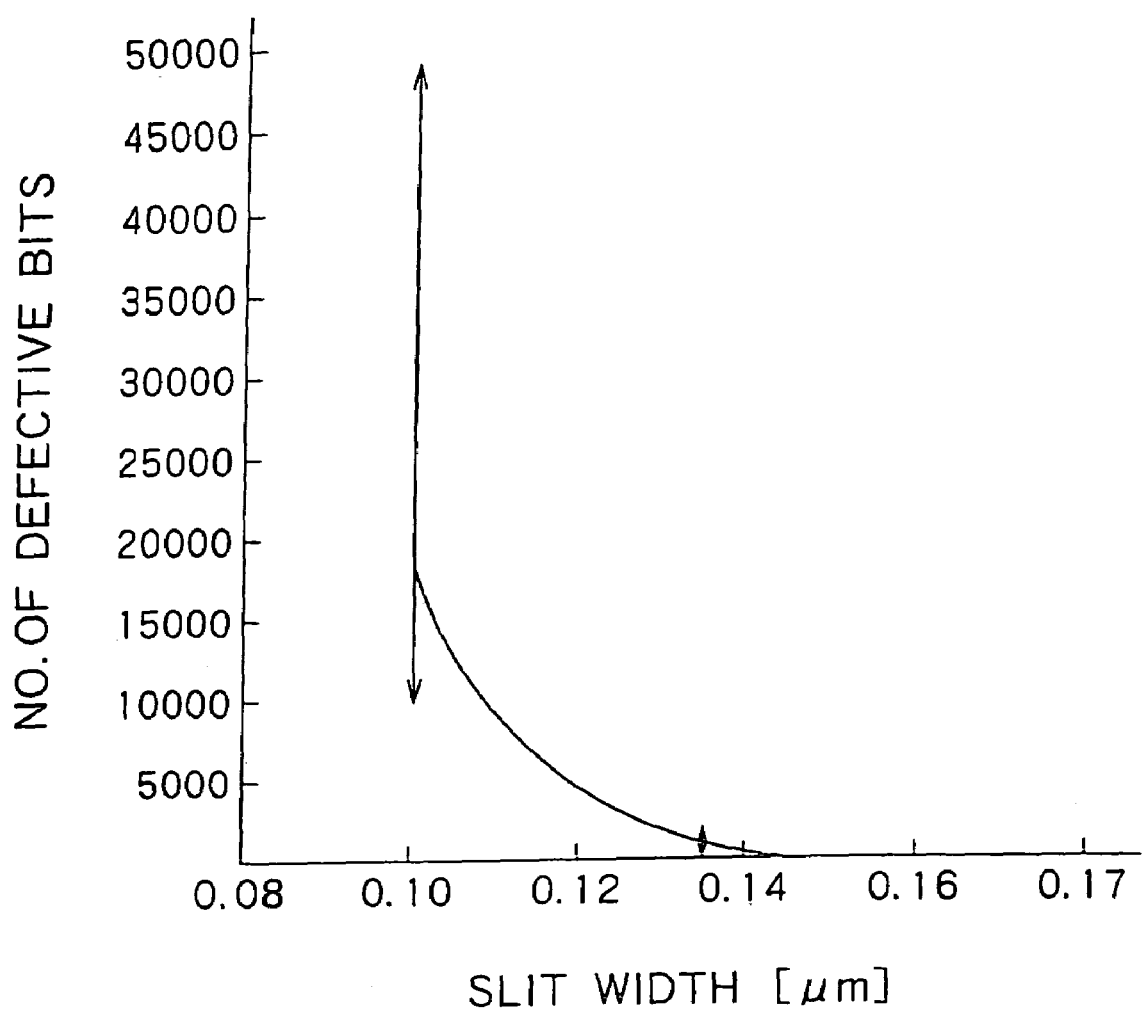
FIG. 26 is a diagram that shows correlation between defective numbers of bits and slit widths for explaining effects of Embodiment 4.

FIG. 26 shows correlations between slit width separating adjacent floating gates and number of defective bits occurring upon movements of electric charges between floating gates. Arrows in FIG. 26 show the range of variance in number of defective bits, and the curve connecting their average values. It is observed that miniaturization of memory cells to enhance the density to the extent decreasing the slit width to 0.14 µm or less invites a serious increase of defective bits. According to the embodiment shown here, substantial slit width can be a+2b by the depth b of the recess in the element isolation/insulation film 4 relative to the slit width a on the plane. More specifically, in a 256 Mbit NAND type EEPROM, if specifications about defective bits require 2 bits/chip, at least 0.14 µm is required as the slit width. In this embodiment, therefore, by making the recess 41 to satisfy a+2b>0.14 [µm], that specification can be satisfied.

In EEPROM according to the invention described above, by separating second gate insulting films between floating gates and control gates above element isolation/insulation films between adjacent memory cells interposing the element isolation/insulation film between them, movements of electric charges between adjacent floating gates can be prevented. Alternatively, even without fully separating the second gate insulating film above device isolating films, by making recesses into surfaces of the element isolation/insulation films and allowing the second gate insulating film to be continuous along the recesses, distance between adjacent floating gates increases substantially, and movements of electric charges between adjacent floating gates can be prevented. Therefore, even when memory cells are microminiaturized, data destruction caused b movements of electric charges can be prevented.

What is claimed is:

1. A nonvolatile semiconductor memory device comprising:
   a semiconductor substrate having a first upper surface;
   an element isolation portion protruding from the first upper surface, the element isolation portion including an upper end portion having a highest portion and a recess, the recess having a bottom portion and an inner surface;
   a first gate electrode film including a second upper surface, the first gate electrode film formed above the first upper surface via a first insulating film, a height of the second upper surface from the first upper surface being lower than a height of the highest portion and being higher than a height of the bottom portion from the first upper surface;
   a second gate electrode film including a third upper surface and an upper side surface, the second gate electrode film formed on the first gate electrode film and separated from an adjacent gate electrode film by the element isolation portion, a height of the third upper surface from the first upper surface being higher than a height of the highest portion from the first upper surface, the upper side surface being continuous with the inner side surface;
   a second insulating film formed directly and continuously on the second gate electrode film and the inner side surface; and
   a third gate electrode film formed on the second insulating film and embedded inside of the inner side surface in the recess.

2. The nonvolatile semiconductor memory device according to claim 1, wherein the second gate electrode film includes a lower side surface located below the upper side surface, the lower side surface faces the element isolation portion and the upper side surface is located on the upper end portion of the element isolation portion.

3. The nonvolatile semiconductor memory device according to claim 2, wherein the upper side surface of the second gate electrode film is flush with the inner side surface of the recess.

4. The nonvolatile semiconductor memory device according to claim 1, wherein the second insulating film includes a pair of silicon oxide films and a silicon nitride film located between the silicon oxide films.

5. The nonvolatile semiconductor memory device according to claim 1, inner side surface of the recess is perpendicularly formed to the first upper surface of the semiconductor substrate.

6. The nonvolatile semiconductor memory device according to claim 1, wherein the whole inner side surface of the recess contacts the second insulating film.

7. The nonvolatile semiconductor memory device according to claim 1, wherein a distance along an inside of the recess between the second gate electrodes that are adjacent to each other is at least 0.14 µ.

8. A nonvolatile semiconductor memory device comprising:
   a semiconductor substrate having a first upper surface;
   an element isolation portion protruding from the first upper surface, the element isolation portion including an upper end portion having a highest portion, a recess having a bottom portion and a side upper portion having an inclined surface, the recess having an inner surface, and a height of a bottom portion from the first upper surface being lower than a height of a lower edge of the inclined surface from the first upper surface;
   a floating gate including a second upper surface, the floating gate formed above the first upper surface via a first insulating film and separated from an adjacent floating gate by the element isolation portion, a height of the second upper surface from the first upper surface being higher than the height of the highest portion from the first upper surface;
   a second insulating film formed on the floating gate and the inner surface of the recess; and
   a control gate formed on the second insulating film and embedded inside of the inner surface in the recess.

9. The nonvolatile semiconductor memory device according to claim 8, wherein the floating gate includes a lower side surface located below the upper side surface, the lower side surface faces and directly contacts with the element isolation portion and the upper side surface is located on the upper end portion of the element isolation portion.

10. The nonvolatile semiconductor memory device according to claim 9, wherein the upper side surface of the floating gate is flush with the inner side surface of the recess.

11. The nonvolatile semiconductor memory device according to claim 8, wherein the second insulating film includes a pair of silicon oxide films and a silicon nitride film located between the silicon oxide films.

12. The nonvolatile semiconductor memory device according to claim 8, wherein the inner surface of the recess is perpendicularly formed to the first upper surface of the semiconductor substrate.

13. The nonvolatile semiconductor memory device according to claim 8, wherein the whole inner side surface of the recess contacts the second insulating film.

14. The nonvolatile semiconductor memory device according to claim 8, wherein a distance along an inside of the recess between the floating gates that are adjacent to each other is at least 0.14 μ.

15. A nonvolatile semiconductor memory device comprising:
a semiconductor substrate having a first upper surface;
an element isolation portion protruding from the first upper surface, the element isolation portion including an upper end portion having a highest portion and a recess, the recess having an inner surface and a bottom portion;
a floating gate including a second upper surface, the floating gate formed above the first upper surface via a first insulating film and separated from an adjacent floating gate by the element isolation portion, a height of the second upper surface from the first upper surface being higher than a height of the highest portion from the first upper surface, the upper side surface being continuously with the inner surface of the recess;
a second insulating film formed directly and continuously on the floating gate and the inner side surface of the recess; and
a control gate formed on the second insulating film and embedded inside of the inner surface in the recess,
wherein a height of the bottom portion from the first upper surface is the same as a height of the first upper surface.

16. The nonvolatile semiconductor memory device according to claim 15, wherein the floating gate includes a lower side surface located below the upper side surface, the lower side surface faces and directly contacts with the element isolation portion and the upper side surface is located on the upper end portion of the element isolation portion.

17. The nonvolatile semiconductor memory device according to claim 16, wherein the upper side surface of the floating gate is flush with the inner side surface of the recess.

18. The nonvolatile semiconductor memory device according to claim 15, wherein the second insulating film includes a pair of silicon oxide films and a silicon nitride film located between the silicon oxide films.

19. The nonvolatile semiconductor memory device according to claim 15, wherein the inner surface of the recess is perpendicularly formed to the first upper surface of the semiconductor substrate.

20. The nonvolatile semiconductor memory device according to claim 15, wherein the whole inner side surface of the recess contacts the second insulating film.

21. The nonvolatile semiconductor memory device according to claim 15, wherein a distance along an inside of the recess between the floating gates that are adjacent to each other is at least 0.14 μ.

22. A nonvolatile semiconductor memory device comprising:
a semiconductor substrate having a first upper surface;
an element isolation portion protruding from the first upper surface, the element isolation portion including an upper end portion having a highest portion, a first side surface, and a recess, the recess including a pair of inner side surfaces and an inner bottom surface formed between the inner side surfaces;
a floating gate including a second side surface facing and directly contacting with the first side surface and a third side surface located above the second side surface, the floating gate formed above the first upper surface via a first insulating film and separated from an adjacent floating gate by the element isolation portion, the whole second side surface facing the inner side surface in the recess via the element isolation portion, and the third side surface being continuous with the inner side surface;
a second insulating film formed directly and continuously on the floating gate, a pair of inner side surfaces and the inner bottom surface; and
a control gate formed on the second insulating film, the control gate embedded between the second insulating film formed on one of the pair of inner side surfaces and the second insulating film formed on the other of the pair of inner side surfaces above the inner bottom surface.

23. The nonvolatile semiconductor memory device according to claim 22, wherein the floating gate further includes a third side surface located on the upper end portion of the element isolation portion.

24. The nonvolatile semiconductor memory device according to claim 23, wherein the third side surface of the floating gate is flush with one of the inner side surface of the recess.

25. The nonvolatile semiconductor memory device according to claim 22, wherein the pair of the inner side surfaces are perpendicularly formed to the first upper surface of the semiconductor substrate, respectively.

26. The nonvolatile semiconductor memory device according to claim 22, wherein the second insulating film includes a pair of silicon oxide films and a silicon nitride film located between the silicon oxide films.

27. The nonvolatile semiconductor memory device according to claim 22, wherein the element isolation portion is located on a shallow trench formed in the semiconductor substrate.

28. The nonvolatile semiconductor memory device according to claim 22, wherein the whole inner side surface of the recess contacts the second insulating film.

29. The nonvolatile semiconductor memory device according to claim 22, wherein a distance along an inside of the recess between the floating gates that are adjacent to each other is at least 0.14 μ.

30. The nonvolatile semiconductor memory device comprising:
a semiconductor substrate having a first upper surface;
an element isolation portion protruding from the first upper surface, the element isolation portion including an upper end portion having a first side surface and a recess, the recess including a pair of inner side surfaces;
a floating gate formed above the first upper surface via a first insulating film and separated from an adjacent floating gate by the element isolation portion, the floating gate including a second side surface facing to and directly contacting with the first side surface of the recess element isolation portion and a third side surface located on the second side surface, the whole second side surface facing one of the pair of inner side surfaces in the recess via the element isolation portion and the third side surface being continuous with one of the inner side surfaces of the recess;
a second insulating film formed directly and continuously on the floating gate and a pair of inner side surfaces, the second insulating film continuously formed on the pair of inner side surfaces; and a control gate formed on the second insulating film, the control gate embedded between the pair of inner side surfaces via the second insulating film.

31. The nonvolatile semiconductor memory device according to claim 30, wherein the a third side surface of the floating gate is located on the upper end portion of the element isolation portion.

32. The nonvolatile semiconductor memory device according to claim 31, wherein the third side surface of the floating gate is flush with one of the pair of inner side surfaces.

33. The nonvolatile semiconductor memory device according to claim 30, wherein the pair of inner side surfaces are perpendicularly formed to the first upper surface of the semiconductor substrate, respectively.

34. The nonvolatile semiconductor memory device according to claim 30, wherein the second insulating film includes a pair of silicon oxide films and a silicon nitride film located between the silicon oxide films.

35. The nonvolatile semiconductor memory device according to claim 30, wherein the element isolation portion is located on a shallow trench formed in the semiconductor substrate.

36. The nonvolatile semiconductor memory device according to claim 30, wherein a distance along an inside of the recess between the floating gates that are adjacent to each other is at least 0.14 μ.

37. The nonvolatile semiconductor memory device according to claim 30, wherein the whole inner side surface of the recess contacts the second insulating film.

38. The nonvolatile semiconductor memory device according to claim 37, wherein the third side surface of the floating gate is located on the upper end portion of the element isolation portion.

39. The nonvolatile semiconductor memory device according to claim 37, wherein the third side surface of the floating gate is flush with the inner side surface of the recess.

40. The nonvolatile semiconductor memory device according to claim 37, wherein the inner side surface of the recess is perpendicularly formed to the first upper surface of the semiconductor substrate.

41. The nonvolatile semiconductor memory device according to claim 37, wherein the second insulating film includes a pair of silicon oxide films and a silicon nitride film located between the silicon oxide films.

42. The nonvolatile semiconductor memory device according to claim 37, wherein the whole inner side surface of the recess contacts the second insulating film.

43. A nonvolatile semiconductor memory device comprising:
a semiconductor substrate having a first upper surface;
an element isolation portion having a first portion embedded in a tapered trench of the semiconductor substrate and a second portion protruding from the first upper surface, the element isolation portion including an upper end portion having a first side surface and a recess, the recess including a pair of inner side surfaces;
a floating gate formed above the first upper surface via a first insulating film and separated from an adjacent floating gate by the element isolation portion, the floating gate including a second side surface facing to and directly contacting with the first side surface of the element isolation portion and a third side surface located on the second side surface, the whole second side surface facing the inner side surface in the recess via the element isolation portion, and the end of the third side surface continuously connected to the inner side surface of the recess;
a second insulating film formed directly and continuously on the floating gate and a pair of inner side surfaces; and
a control gate formed on the second insulating film, the control gate embedded in the recess via the second insulating film.

44. The nonvolatile semiconductor memory device according to claim 43, wherein a distance along an inside of the recess between the floating gates that are adjacent to each other is at least 0.14 μ.

* * * * *